US011239741B2

(12) United States Patent
Miyazawa et al.

(10) Patent No.: US 11,239,741 B2
(45) Date of Patent: Feb. 1, 2022

(54) SEMICONDUCTOR SWITCH CONTROL CIRCUIT AND SWITCHING POWER SOURCE DEVICE

(71) Applicant: SHINDENGEN ELECTRIC MANUFACTURING CO., LTD., Tokyo (JP)

(72) Inventors: Wataru Miyazawa, Saitama (JP); Shigeru Hisada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/979,523

(22) PCT Filed: Mar. 16, 2018

(86) PCT No.: PCT/JP2018/010355
§ 371 (c)(1),
(2) Date: Sep. 10, 2020

(87) PCT Pub. No.: WO2019/176077
PCT Pub. Date: Sep. 19, 2019

(65) Prior Publication Data
US 2021/0249946 A1    Aug. 12, 2021

(51) Int. Cl.
*H03K 17/08* (2006.01)
*H02M 1/08* (2006.01)
(Continued)

(52) U.S. Cl.
CPC ........... *H02M 1/08* (2013.01); *H02M 1/0009* (2021.05); *H02M 1/0054* (2021.05);
(Continued)

(58) Field of Classification Search
CPC ................ H03K 17/04; H03K 17/041; H03K 17/04106; H03K 17/0412; H03K 17/0416;
(Continued)

(56) References Cited

U.S. PATENT DOCUMENTS 6,144,245 A * 11/2000 Balogh ............... H03K 17/0822
                                                      323/282
6,351,107 B1* 2/2002 Okita ................ H03K 17/04213
                                                      323/282
(Continued)

FOREIGN PATENT DOCUMENTS

JP        200178435 A        3/2001
JP        200922106 A        1/2009
JP        2014171354 A       9/2014

OTHER PUBLICATIONS

International Search Report in PCT/JP2018/010355, dated May 29, 2018. 2pp.
(Continued)

*Primary Examiner* — Long Nguyen
(74) *Attorney, Agent, or Firm* — Hauptman Ham, LLP

(57) ABSTRACT

A semiconductor switch control circuit includes: a pulse signal generating part configured to generate a pulse signal which becomes a time reference for performing an ON/OFF control of a semiconductor switch; a drive current generating part configured to generate a drive current based on the pulse signal which the pulse signal generating part generates and to supply the drive current to a gate electrode of the semiconductor switch; a current detecting part configured to detect a drain current or a source current of the semiconductor switch; and a drive current control part configured to have a function of controlling a drive current which the drive current generating part generates based on the pulse signal
(Continued)

which the pulse signal generating part generates and the current which the current detecting part detects.

18 Claims, 31 Drawing Sheets

(51) Int. Cl.
    *H02M 1/00*     (2006.01)
    *H03K 17/041*     (2006.01)
    *H03K 17/082*     (2006.01)
    *H03K 17/16*     (2006.01)
    *H03K 19/01*     (2006.01)

(52) U.S. Cl.
    CPC ... *H03K 17/04106* (2013.01); *H03K 17/0822* (2013.01); *H03K 17/162* (2013.01); *H03K 19/01* (2013.01)

(58) Field of Classification Search
    CPC ....... H03K 17/04123; H03K 17/04163; H03K 17/042; H03K 17/04206; H03K 17/06; H03K 17/063; H03K 17/08; H03K 17/081; H03K 17/08104; H03K 17/0812; H03K 17/08122; H03K 17/08142; H03K 17/082; H03K 17/0822; H03K 17/016; H03K 17/161; H03K 17/162; H03K 17/165; H03K 19/01; H03K 19/017; H01K 17/0814; H01M 1/08; H01M 1/0054; H01M 1/0009

See application file for complete search history.

(56) References Cited

U.S. PATENT DOCUMENTS

2005/0077948 A1    4/2005    Kojima
2009/0015224 A1    1/2009    Hirao et al.
2014/0159687 A1    6/2014    Lee
2018/0343002 A1*  11/2018    Zmood ................ H03K 17/567

OTHER PUBLICATIONS

Extended European Search Report in EP Application No. 18909619.1, dated Sep. 23, 2021. 8pp.

* cited by examiner

※: ID level detection pulse generator 31 includes a current detecting part and a second pulse signal generating part

SEMICONDUCTOR SWITCH CONTROL CIRCUIT AND SWITCHING POWER SOURCE DEVICE

RELATED APPLICATIONS

The present application is a National Phase of International Application Number PCT/JP2018/010355, filed Mar. 16, 2018.

TECHNICAL FIELD

The present invention relates to a semiconductor switch control circuit and a switching power source device.

BACKGROUND ART

Recently, along with the progress of the development of next generation devices which use a wide band gap semiconductor made of SiC or GaN. For example, the expectation for a highly efficient and miniaturized switching power source device 101 shown in FIG. 29 has been increased. Under such expectation, a wide band gap semiconductor which is a semiconductor switch having a considerably low ON resistance thus having a considerably high switching speed compared to a conventional semiconductor has been attracting attention.

The switching power source device 101 is a so-called PFC step-up chopper circuit, increases an inputted voltage to a desired voltage, and supplies the predetermined voltage to a load not shown in the drawing from a pair of output terminals. A wide band gap semiconductor (for example, silicon carbide, gallium nitride, gallium oxide, diamond or the like) is used as a semiconductor switch 106 of such a switching power source device 101, it is possible to realize the acquisition of high efficiency and miniaturization of the device due to characteristics of the wide gap band such as low ON resistance and high speed switching.

PRIOR ART DOCUMENT

Patent Document

Patent document 1: JP 2009-22106 A

SUMMARY OF INVENTION

Problem to be Solved by the Invention

However, when a wide band gap semiconductor is used as a semiconductor switch, although high speed switching can be realized, as shown in FIG. 30, there is a concern that unexpected self-oscillation is generated due to a parasitic capacitor or a parasitic inductor during a turn-off period. Particularly, when a threshold value of a semiconductor switch of the wide band gap semiconductor is low, the semiconductor switch is erroneously operated due to self-oscillation thus giving rise to a possibility that the semiconductor switch or a circuit part around the semiconductor switch is broken.

In view of the above, in the above-mentioned switching power source device, as described in patent document 1, a technique is considered where a negative-voltage-use power source is added to the switching power source device, and a gate voltage during a turn-off period is biased to a negative voltage. However, the switching power source device which is obtained by adding the negative-voltage-use power source to the switching power source device has the complicated configuration. Further, even when such a configuration is adopted, self-oscillation is generated at the timing that a large switching current flows such as at the time of starting a power source or at the time that an overload is applied thus eventually bringing about a possibility that a semiconductor switch or a circuit part around the semiconductor switch is broken (see a gate voltage waveform in an overload region shown in FIG. 31). In a load characteristic diagram shown in FIG. 31 (a load characteristic diagram having a so-called drooping characteristic), the diagram shows a load characteristic in a case where an overcurrent restricting and protecting circuit which has a fixed power drooping characteristic at a predetermined output current (power) or more and has a winding drooping characteristic generated by a burst control circuit below a predetermined output current (power) is used. As shown in FIG. 31, an operation between a point B (switching point to a burst control) and a point C (switching stop point) is subjected to a burst control and hence, a switching current is restricted whereby the above-mentioned self-oscillation is minimally generated. However, an operation between a point A (drooping start point) and the point B is subjected to a fixed power drooping control and hence, a maximum current flows as a switching current whereby the above-mentioned concern exists. This concern exists also at the time of starting a switching power source.

The present invention has been made in view of the above-mentioned circumstances, and it is an object of the present invention to provide a semiconductor switch control circuit where self-oscillation is minimally generated even at the timing that a large switching current flows such as at the time of starting a power source or when an overload is applied.

Solution to Problem

[1] According to an aspect of the present invention, there is provided a semiconductor switch control circuit configured to perform an ON/OFF control of a semiconductor switch having a source electrode, a drain electrode and a gate electrode by supplying a drive current to the gate electrode, the semiconductor switch control circuit including: a pulse signal generating part configured to generate a pulse signal which becomes a time reference for performing the ON/OFF control of the semiconductor switch; a drive current generating part configured to generate the drive current based on the pulse signal which the pulse signal generating part generates and to supply the drive current to the gate electrode of the semiconductor switch; a current detecting part configured to detect a drain current or a source current of the semiconductor switch, or a current which flows through a predetermined current path of a peripheral circuit of the semiconductor switch; and a drive current control part configured to have a function of controlling the drive current which the drive current generating part generates based on the pulse signal which the pulse signal generating part generates and the current which the current detecting part detects.

[2] According to the semiconductor switch control circuit of the present invention, it is preferable that the drive current generating part include: a source part configured to charge a current to the gate electrode of the semiconductor switch; and a sink part configured to discharge a current from the gate electrode of the semiconductor switch, and the drive current control part be configured to control the drive current by controlling a charge current to be charged to the gate electrode of the semiconductor switch, or a discharge current to be discharged from the gate electrode of the semiconductor switch.

[3] According to the semiconductor switch control circuit of the present invention, it is preferable that the drive current control part be configured, when a current which the current detecting part detects exceeds a predetermined first set current, to control the drive current such that a falling speed of a gate voltage during a turn-off period of the semiconductor switch becomes lower than the falling speed of the gate voltage before detection of the current by the current detecting part which exceeds the predetermined first set current.

[4] According to the semiconductor switch control circuit of the present invention, it is preferable that the drive current control part be capable of setting a plurality of current levels as the first set current, and be configured to control the drive current such that the falling speed of the gate voltage is lowered in a stepwise manner in accordance with a detection of a current which exceeds a higher current level among the plurality of current levels by the current detection part.

[5] According to the semiconductor switch control circuit of the present invention, it is preferable that the semiconductor switch control circuit further include a second pulse signal generating part configured to generate a second pulse signal when a current which the current detecting part detects exceeds the first set current, wherein the drive current control part be configured to control the drive current based on the second pulse signal which the second pulse signal generating part generates.

[6] According to the semiconductor switch control circuit of the present invention, it is preferable that the sink part include a plurality of discharge current paths which are connected to each other in parallel, and the drive current control part include: an R terminal into which the pulse signal from the pulse signal generating part is inputted; an S terminal into which the second pulse signal from the second pulse signal generating part is inputted; and a Q terminal from which a control signal for controlling the discharge current is outputted, and the drive current control part also include an RS flip-flop which is configured, when the second pulse signal is inputted from the second pulse signal generating part during an ON period, to stop a discharge operation on at least one discharge current path out of the plurality of discharge current paths at the time of turning off the semiconductor switch following the ON period.

[7] According to the semiconductor switch control circuit of the present invention, it is preferable that the sink part include a plurality of discharge current paths which are connected to each other in parallel, and the drive current control part includes a charge/discharge control part which is configured, when the second pulse signal is inputted from the second pulse signal generating part during an ON period, to stop a discharge operation on at least one discharge current path out of the plurality of discharge current paths at the time of turning off the semiconductor switch following the ON period.

[8] According to the semiconductor switch control circuit of the present invention, it is preferable that the plurality of discharge current paths respectively have different discharge abilities.

[9] According to the semiconductor switch control circuit of the present invention, it is preferable that the drive current control part include a charge/discharge control part which is configured, when the second pulse signal is inputted from the second pulse signal generating part during an ON period, to decrease, in an analogue manner, a current amount of a current which flows through the sink part at the time of turning off the semiconductor switch following the ON period.

[10] According to the semiconductor switch control circuit of the present invention, it is preferable that the drive current control part be configured, when a current which the current detecting part detects exceeds a predetermined second set current, to control the drive current such that a rising speed of the gate voltage during a turn-on period of the semiconductor switch becomes lower than the rising speed of the gate voltage before detection of the current by the current detecting part which exceeds the predetermined second set current.

[11] According to the semiconductor switch control circuit of the present invention, it is preferable that the drive current control part be capable of setting a plurality of current levels as the second set current, and be configured to control the drive current such that the rising speed of the gate voltage is lowered in a stepwise manner in accordance with a detection of a current which exceeds a higher current level among the plurality of current levels by the current detection part.

[12] According to the semiconductor switch control circuit of the present invention, it is preferable that the semiconductor switch control circuit further include a third pulse signal generating part configured to generate a third pulse signal when a current which the current detecting part detects exceeds the second set current, wherein the drive current control part is configured to have a function of controlling the drive current based on the third pulse signal which the third pulse signal generating part generates.

[13] According to the semiconductor switch control circuit of the present invention, it is preferable that the source part include a plurality of charge current paths which are connected to each other in parallel, and the drive current control part include: an R terminal into which the pulse signal from the pulse signal generating part is inputted; an S terminal into which the third pulse signal from the third pulse signal generating part is inputted; and a Q terminal from which a control signal for controlling the charge current is outputted, and the drive current control part also include an RS flip-flop which is configured, when the third pulse signal is inputted from the third pulse signal generating part during an ON period, to stop a charge operation on at least one charge current path out of the plurality of charge current paths at the time of turning on the semiconductor switch during an ON period next to the ON period.

[14] According to the semiconductor switch control circuit of the present invention, it is preferable that the source part include a plurality of charge current paths which are connected to each other in parallel, and the drive current control part be configured, when the third pulse signal is inputted from the third pulse signal generating part during an ON period, to stop a charge operation on at least one charge current path out of the plurality of charge current paths at the time of turning on the semiconductor switch during an ON period next to the ON period.

[15] According to the semiconductor switch control circuit of the present invention, it is preferable that the plurality of charge current paths respectively have different charge abilities.

[16] According to the semiconductor switch control circuit of the present invention, it is preferable that the drive current control part include a charge/discharge control part which is configured, when the third pulse signal is inputted from the third pulse signal generating part during an ON period, to decrease, in an analogue manner, a current amount of a current which flows through the source part at the time of turning on the semiconductor switch during an ON period next to the ON period.

[17] According to the semiconductor switch control circuit of the present invention, it is preferable that the semiconductor switch control circuit further include a gate voltage detecting part configured to detect a gate voltage of the semiconductor switch, wherein the drive current control part is configured to have a function of controlling the drive current which the drive current generating part generates based on the pulse signal which the pulse signal generating part generates and the gate voltage which the gate voltage detecting part detects.

[18] According to the semiconductor switch control circuit of the present invention, it is preferable that the first set current or the second set current be set to a value which exceeds a current range of the drain current or the source current in a rated load region of the semiconductor switch or a current which flows through a predetermined current path of a peripheral circuit of the semiconductor switch.

[19] According to the semiconductor switch control circuit of the present invention, it is preferable that the semiconductor switch be formed of a wide gap semiconductor.

[20] According to the semiconductor switch control circuit of the present invention, it is preferable that the wide gap semiconductor be formed of silicon carbide, gallium nitride, gallium oxide or diamond.

[21] According to another aspect of the present invention, there is provided a switching power source device including: a semiconductor switch having a source electrode, a drain electrode and a gate electrode; and a semiconductor switch control circuit configured to perform an ON/OFF control of the semiconductor switch by supplying a drive current to the gate electrode of the semiconductor switch, wherein the switching power source device includes the semiconductor switch control circuit according to the present invention as the semiconductor switch control circuit.

Advantageous Effects of Invention

The semiconductor switch control circuit and the switching power source device according to the present invention include the drive current control part which controls a drive current which the drive current generating part generates based on a pulse signal which the pulse signal generating part generates and a current which the current detecting part detects. Accordingly, by controlling a drive current such that a falling speed of a gate voltage or a rising speed of the gate voltage is lowered (becomes slow) at the timing that a large switching current flows such as at the time of starting the power source or at the time that an overload is applied (see FIG. 4, FIG. 7, FIG. 13 and FIG. 16), it is possible to provide the semiconductor switch control circuit and the switching power source device which minimally cause a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied (see FIG. 5 and FIG. 14).

DESCRIPTION OF EMBODIMENTS

Hereinafter, a semiconductor switch control circuit and a switching power source device according to the present invention are described based on embodiments shown in drawings.

Embodiment 1

1. Semiconductor Switch Control Circuit 12 and Switching Power Source Device 1 According to Embodiment 1

Figure 1:
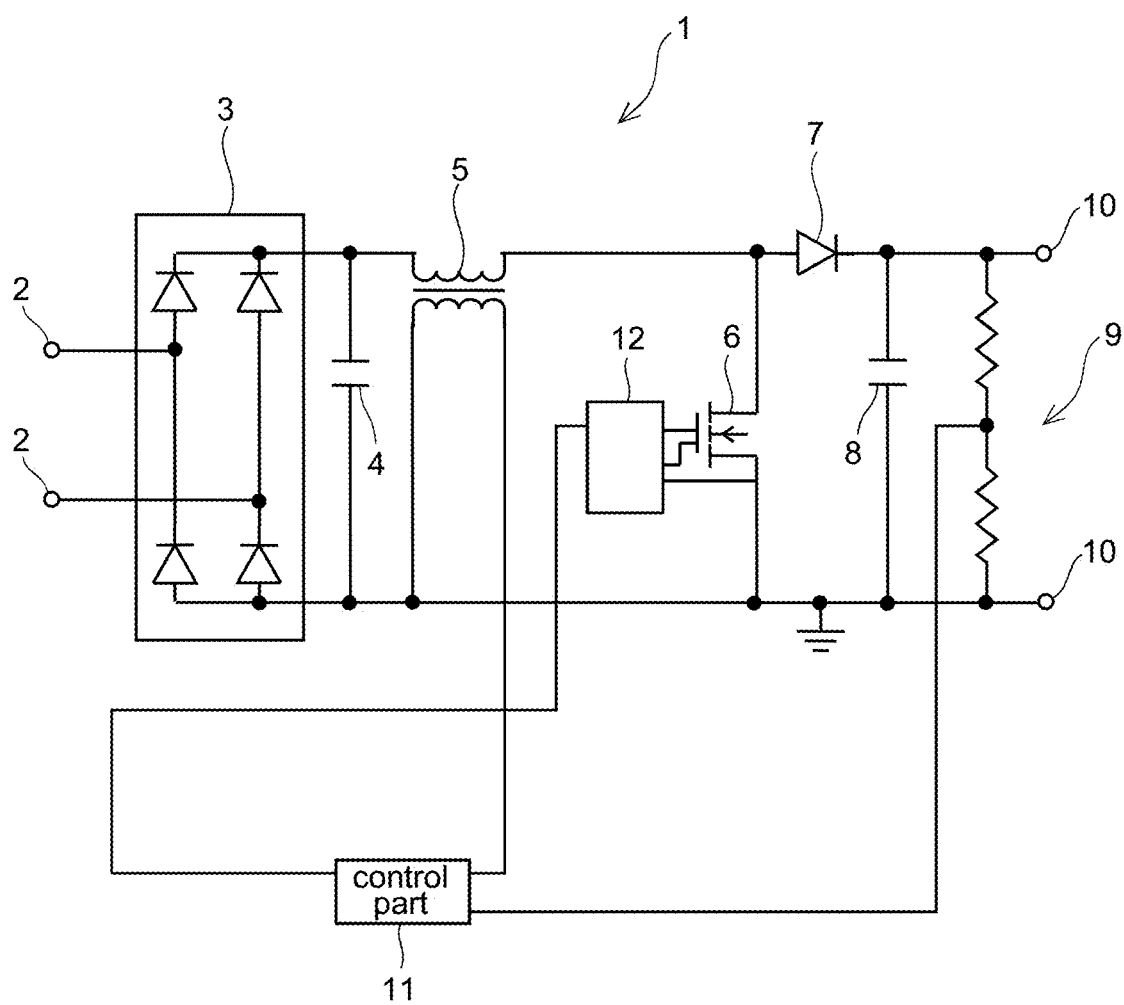
FIG. 1 is a circuit diagram of a switching power source device 1 according to an embodiment 1.
Figure 2:
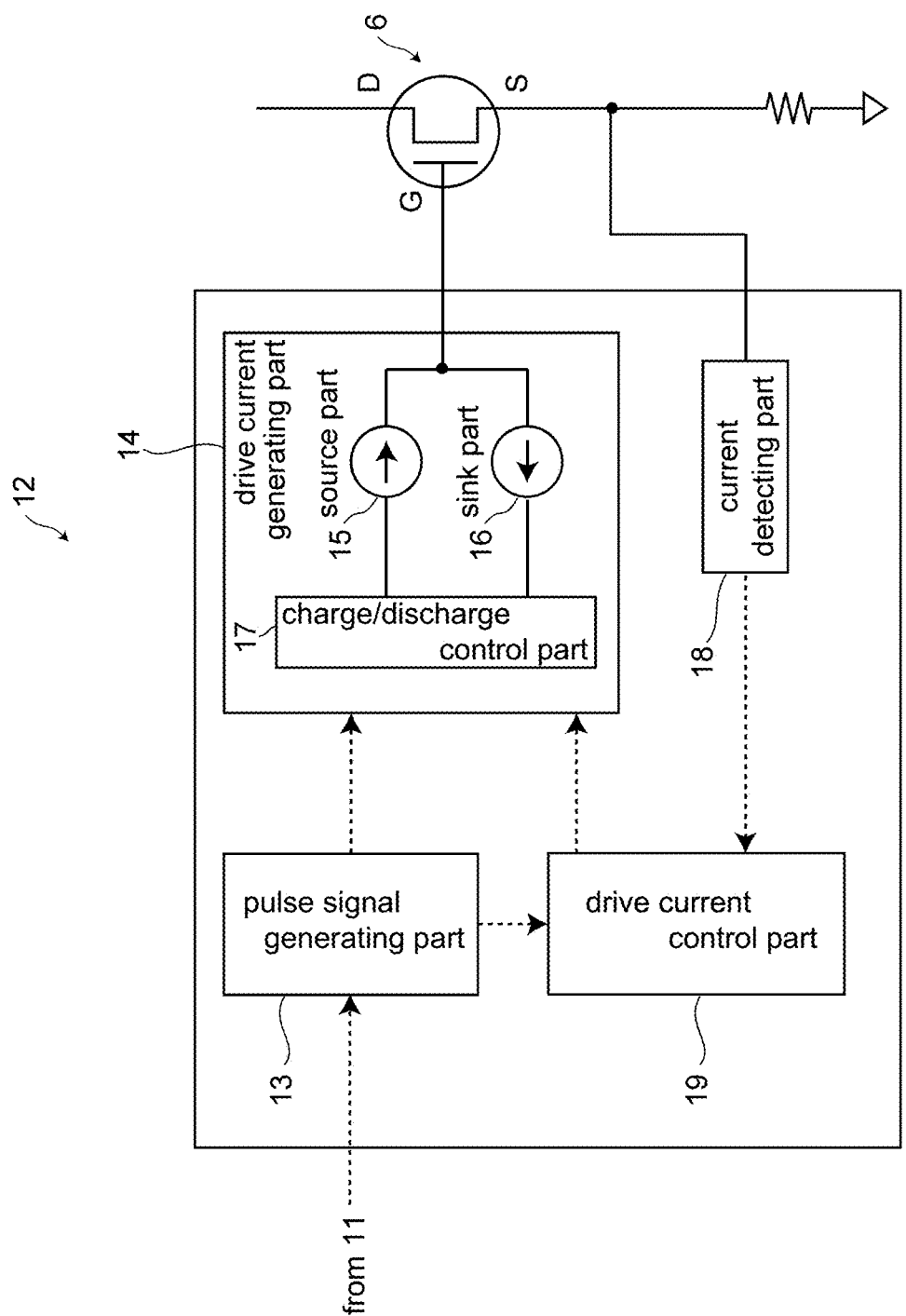
FIG. 2 is a view for describing a semiconductor switch control circuit 12 according to the embodiment 1.

In the embodiment 1, the semiconductor switch control circuit and the switching power source device according to the present invention are described using a case where the semiconductor switch control circuit according to the present invention is applied to a switching power source device formed of a critical-mode-type step-up chopper as an example. FIG. 1 is a circuit diagram of the switching power source device 1 (the switching power source device 1 according to the embodiment 1) which uses the semiconductor switch control circuit 12 according to the embodiment 1. FIG. 2 is a view for describing the semiconductor switch control circuit 12 according to the embodiment 1.

The switching power source device 1 shown in FIG. 1 is the switching power source device 1 according to the embodiment 1, that is, as described above, a critical-mode-type PFC step-up chopper circuit. The switching power source device 1 increases an inputted voltage to a desired voltage, and supplies the desired voltage to a load not shown in the drawing from a pair of output terminals. In the switching power source device 1 according to the embodiment 1, a wide band gap semiconductor (for example, silicon carbide, gallium nitride, gallium oxide, diamond or the like) is used as a semiconductor switch 6, and it is possible to realize the acquisition of high efficiency and miniaturization of the device due to characteristics of the wide band gap semiconductor such as low ON resistance and high speed switching.

The switching power source device 1 having the above-mentioned configuration includes, as a semiconductor switch control circuit, the semiconductor switch control circuit (the semiconductor switch control circuit 12 according to the embodiment 1) described hereinafter.

As shown in FIG. 2, the semiconductor switch control circuit 12 according to the embodiment 1 is a semiconductor switch control circuit which performs an ON/OFF control of the semiconductor switch 6 having a source electrode, a drain electrode and a gate electrode by supplying a drive current to the gate electrode of the semiconductor switch 6. The semiconductor switch control circuit 12 includes: a pulse signal generating part 13 which generates a pulse signal which becomes a time reference for performing an ON/OFF control of the semiconductor switch 6; a drive current generating part 14 which generates a drive current based on the pulse signal which the pulse signal generating part 13 generates, and supplies the drive current to the gate electrode of the semiconductor switch 6; a current detecting part 18 which detects a drain current (or a source current) of the semiconductor switch 6; and a drive current control part 19 which has a function of controlling the drive current which the drive current generating part 14 generates based on the pulse signal which the pulse signal generating part 13 generates and the current which the current detecting part 18 detects. In FIG. 2, symbol 17 indicates a charge/discharge control part.

The drive current generating part 14 includes a source part 15 which charges a current to the gate electrode of the semiconductor switch 6 and a sink part 16 which discharges a current from the gate electrode of the semiconductor switch 6. The drive current control part 19 controls a drive current by controlling a charge current to be charged to the gate electrode of the semiconductor switch 6 or a discharge current to be discharged from the gate electrode of the semiconductor switch 6.

Figure 3A:
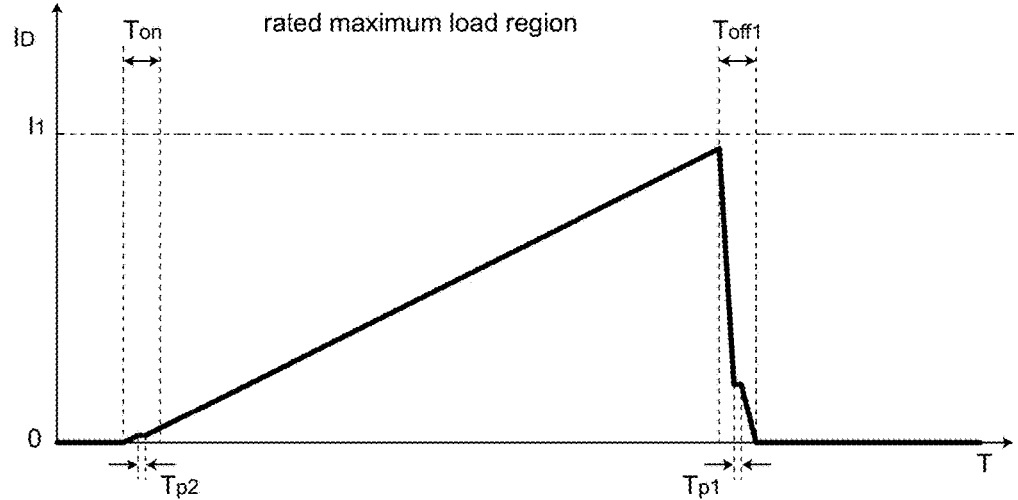
FIGS. 3A to 3C are views schematically showing a waveform of a drain current $I_D$ at the time of performing a switching operation in the switching power source device 1 according to the embodiment 1.
Figure 3B:
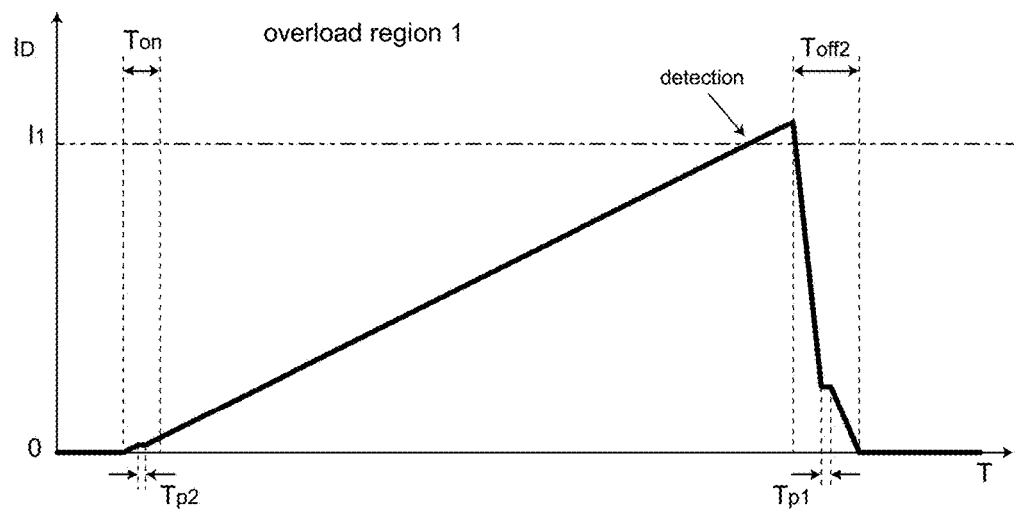
Figure 3C:
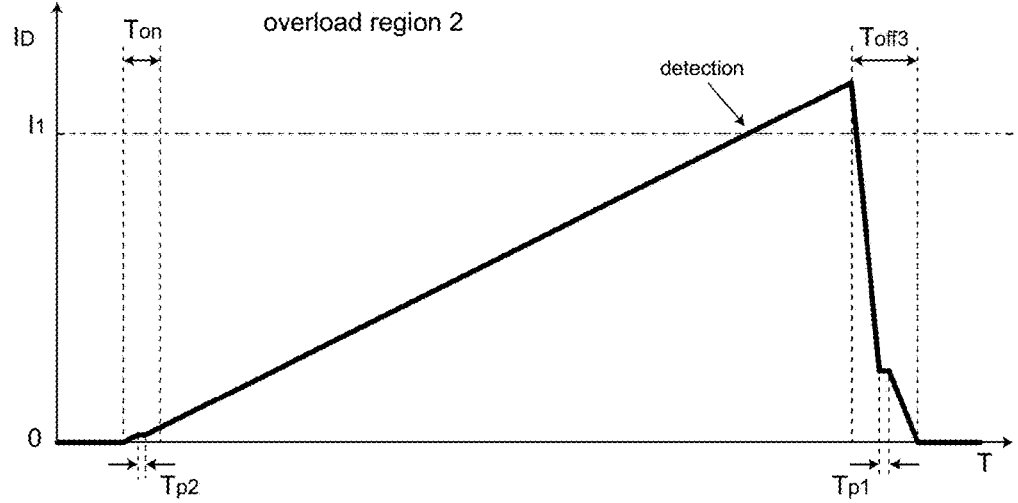

FIGS. 3A to 3C are views schematically showing a waveform of a drain current $I_D$ at the time of performing a switching operation in the switching power source device 1 according to the embodiment 1. FIG. 3A shows a waveform of the drain current $I_D$ in a rated maximum load region, FIG. 3B shows a waveform of the drain current $I_D$ in an overload region 1, and FIG. 3C shows a waveform of the drain current $I_D$ in an overload region 2. The rated maximum load region is a region where the load is heaviest among the rated load regions. The overload region 1 is a region where the load is relatively light among the overload regions, and the overload region 2 is a region where the load is relatively heavy among the overload regions (see FIG. 5 described later).

Figure 4:
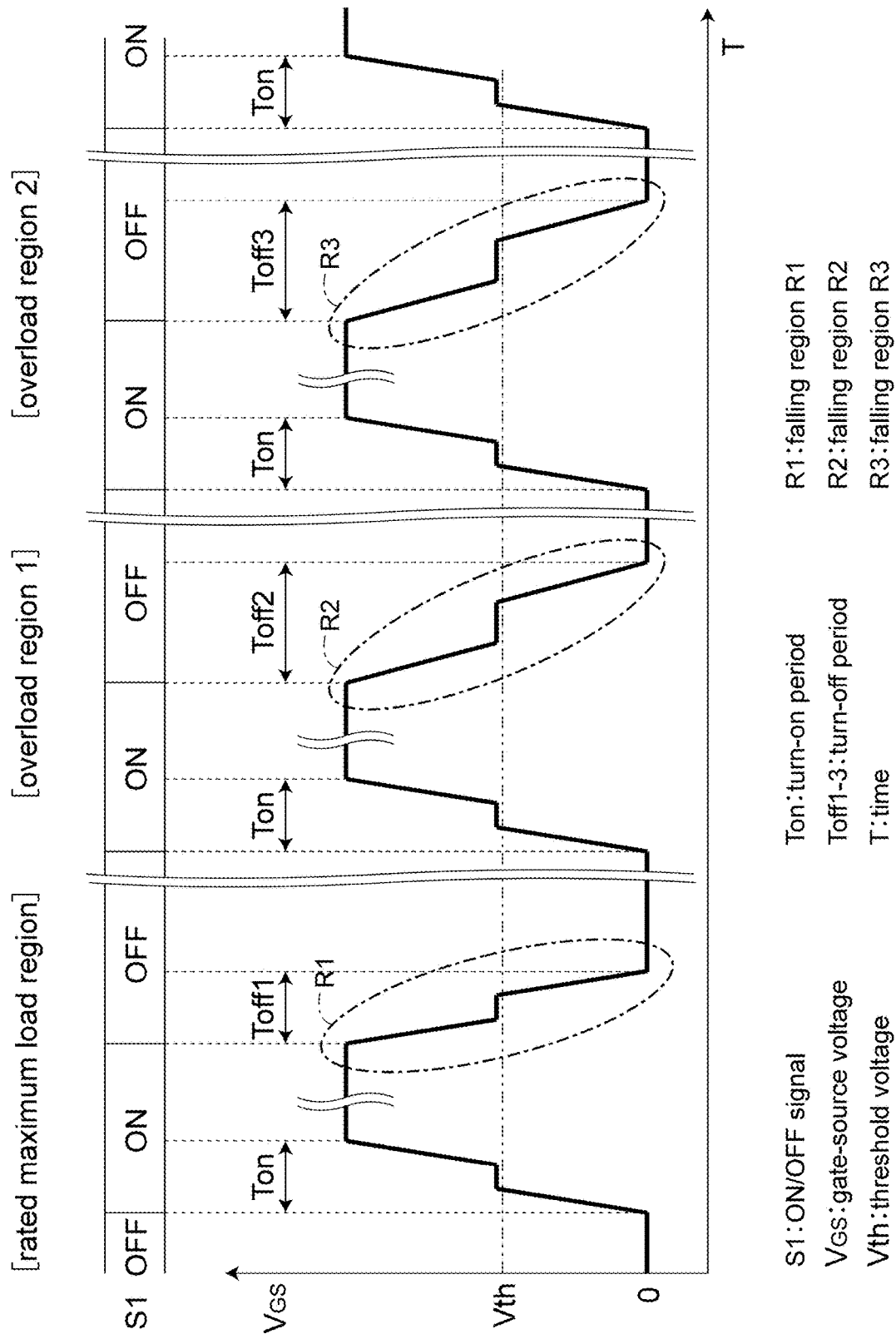
FIG. 4 is a view schematically showing a waveform of a gate voltage $V_{GS}$ at the time of performing the switching operation in the switching power source device 1 according to the embodiment 1.

FIG. 4 is a view schematically showing a waveform of a gate voltage $V_{GS}$ at the time of performing a switching operation in the switching power source device 1 according to the embodiment 1. In the drawing, the waveform of the gate voltage $V_{GS}$ on the most left side is the waveform of the gate voltage $V_{GS}$ in the rated maximum load region, the waveform of the second gate voltage $V_{GS}$ as counted from the left side is the waveform of the gate voltage $V_{GS}$ in the overload region 1, and the waveform of the third gate voltage $V_{GS}$ as counted from the left side is the waveform of the gate voltage $V_{GS}$ in the overload region 2.

Figure 5:
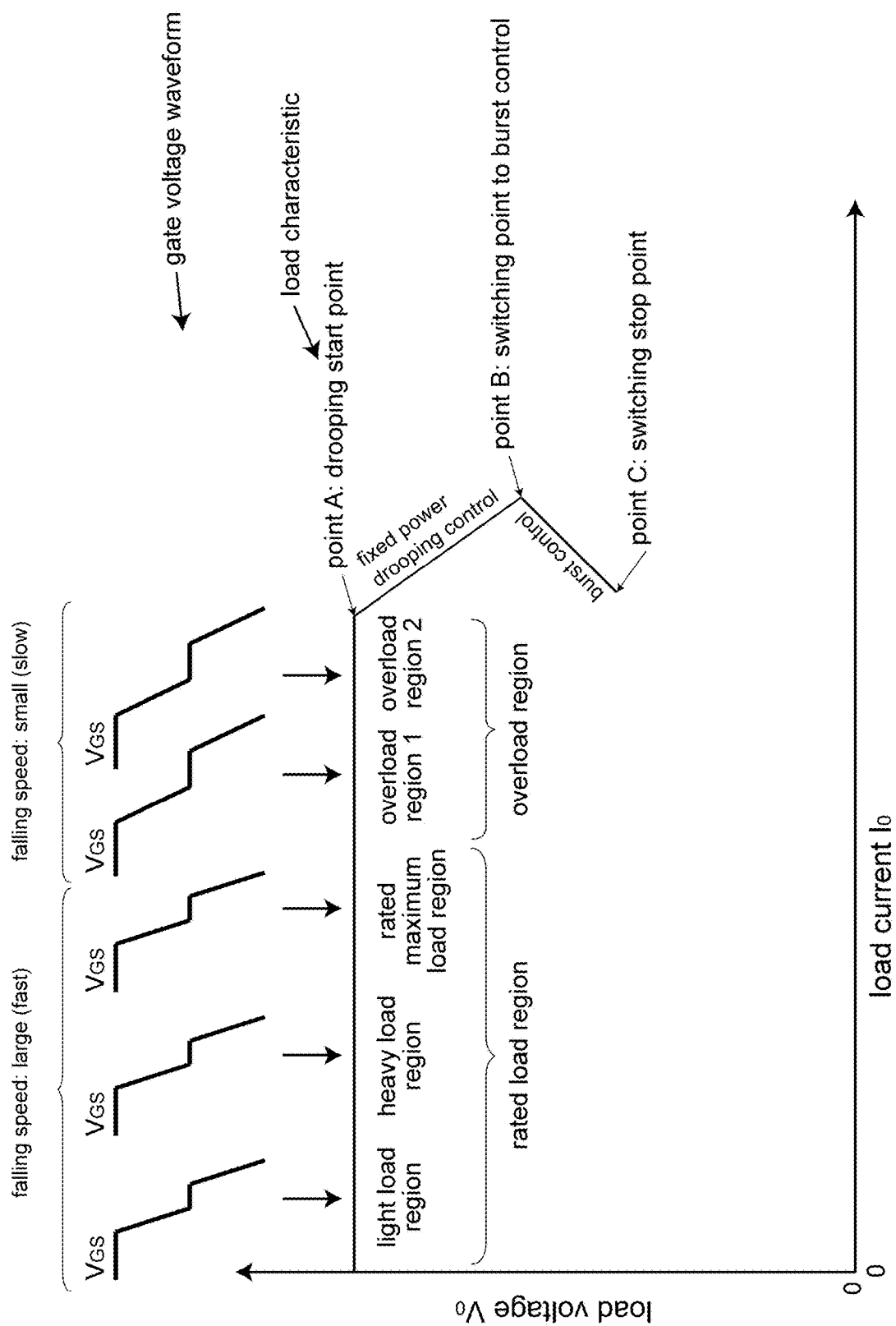
FIG. 5 is a view schematically showing a waveform of a gate voltage $V_{GS}$ at the time of turning off a semiconductor switch 6 in the switching power source device 1 according to the embodiment 1 for every load region together with a load characteristic diagram.

FIG. 5 is a view schematically showing the waveform of a gate voltage $V_{GS}$ at the time of turning off the semiconductor switch 6 in the switching power source device 1 according to the embodiment 1 for every load region together with a load characteristic diagram. In the drawing, the waveform of the gate voltage $V_{GS}$ on the most left side is the waveform of the gate voltage $V_{GS}$ in a light load region, the waveform of the second gate voltage $V_{GS}$ as counted from the left side is the waveform of the gate voltage $V_{GS}$ in a heavy load region, and the waveform of the third gate voltage $V_{GS}$ as counted from the left side is the waveform of the gate voltage $V_{GS}$ in the rated maximum load region, the waveform of the fourth gate voltage $V_{GS}$ as counted from the left side is the waveform of the gate voltage $V_{GS}$ in the overload region 1, and the waveform of the fifth gate voltage $V_{GS}$ as counted from the left side is the waveform of the gate voltage $V_{GS}$ in the overload region 2. The light load region is a region where the load is relatively light among the rated load regions, and the heavy load region is a region where the load is heavier than the load in the light load region among the rated load regions, and the load is lighter than the rated maximum load region (see FIG. 5).

In the semiconductor switch control circuit 12 according to the embodiment 1, when a current detected by the current detecting part 18 exceeds a predetermined first set current $I_1$, the drive current control part 19 controls a drive current such that a falling speed of a gate voltage $V_{GS}$ during a turn-off period of the semiconductor switch 6 becomes lower than the corresponding falling speed of the gate voltage $V_{GS}$ before detection of the current by the current detecting part 18 which exceeds the predetermined first set current $I_1$. (see FIG. 3. and FIG. 4). Accordingly, as can be also understood from FIGS. 3A to 3C and FIG. 4, a falling speed during the turn off period Toff2 in the overload region 1 and the falling speed in a turn off period Toff3 of the overload region 2 become slower than the falling speed during a turn off period Toff1 of the rated maxim load region. Further, corresponding to such a phenomenon, the turn off period Toff2 of the overload region 1 and the turn off period Toff3 of the overload region 2 become longer than the turn off period Toff1 of the rated maximum load region (in this case, Toff2=Toff3>Toff1).

Figure 30:
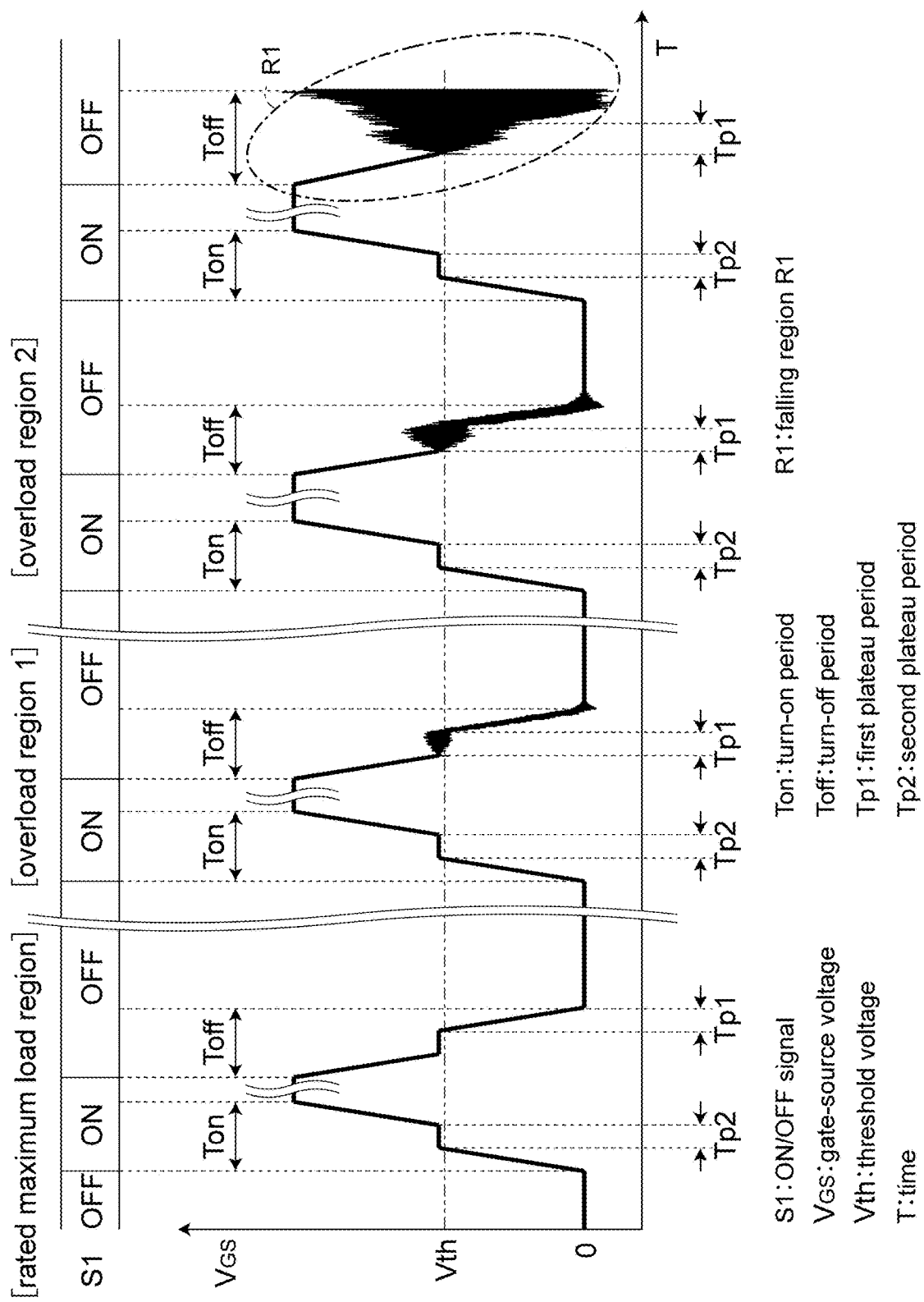
FIG. 30 is a view schematically showing a waveform of a gate voltage $V_{GS}$ at the time of performing a switching operation in the conventional switching power source device 101.
Figure 31:
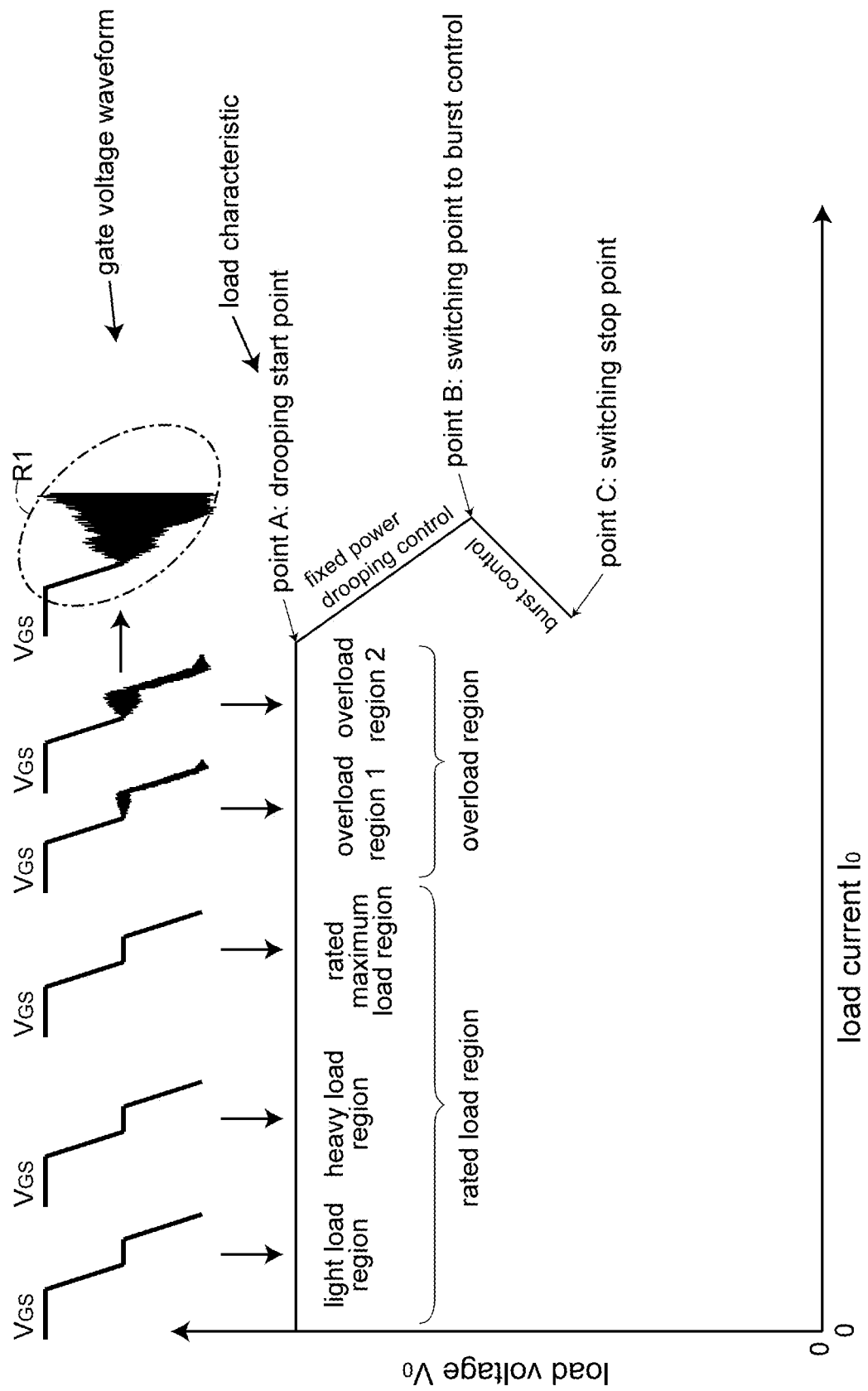
FIG. 31 is a view schematically showing a waveform of a gate voltage $V_{GS}$ at the time of turning off a semiconductor switch in the conventional switching power source device 101 for every load region together with a load characteristic diagram.

The generation of the self-oscillation at the time of turning off the semiconductor switch 6 starts when the load goes beyond the rated maximum load region and falls in the overload region 1, and is increased when the load falls in the overload region 2. In such an operation, when the situation is left as it is, the self-oscillation is extremely increased as in the case of the prior art thus giving rise to a case where a semiconductor switch is erroneously operated due to such self-oscillation so that the semiconductor switch or a circuit part around the semiconductor switch is broken (see the waveform of the gate voltage $V_{GS}$ in the overload region 2 in FIG. 30 and FIG. 31). To the contrary, in the semiconductor switch control circuit 12 according to the embodiment 1, when the load falls in the overload region 1 (when the drain current $I_D$ exceeds the first set current $I_1$), a drive current is controlled such that a falling speed of the gate voltage $V_{GS}$ becomes lower than the falling speed before detection of the current by the current detecting part which exceeds the predetermined first set current $I_1$ and hence, the self-oscillation is suppressed. As a result, it is possible to maintain the self-oscillation at a level where an erroneous operation of the semiconductor switch 6 is not induced (see the waveform of the gate voltage $V_{GS}$ in the overload region 1 and the overload region 2 shown in FIG. 4 and FIG. 5).

In the semiconductor switch control circuit 12 according to the embodiment 1, assume a case where a drain current $I_D$ which the current detecting part 18 detects during the ON period exceeds a first set current $I_1$. In such a case, a falling speed is readily lowered (becomes readily slow) during the turn-off period following the ON period (see FIGS. 3A to 3C and FIG. 4). With such a configuration, it is possible to acquire a high self-oscillation suppressing effect. In the present invention, a falling speed may be lowered (become slow) during a turn-off period after the next ON period. With such a configuration, a control of the drive current control part 19 can be performed at a speed which is not so high.

The first set current $I_1$ is set to a value which exceeds a current range of a drain current (or a source current) in the rated maximum load region (see FIG. 3A). In a case where the first set current $I_1$ is set to a value slightly larger than the rated maximum load region, although a self-oscillation suppressing effect is increased, a turn-off period is unnecessarily prolonged and a switching speed becomes excessively slow. Accordingly, such setting of the first set current $I_1$ is not desirable. On the other hand, in a case where the first set current $I_1$ is set to a value considerably larger than the rated maximum load, a self-oscillation suppressing effect cannot be sufficiently acquired. Accordingly, such setting of the first set current $I_1$ is not desirable. From this point of view, it is preferable to set the first set current $I_1$ to a value which takes into account the self-oscillation suppressing effect and the turn-off period.

Figure 6A:
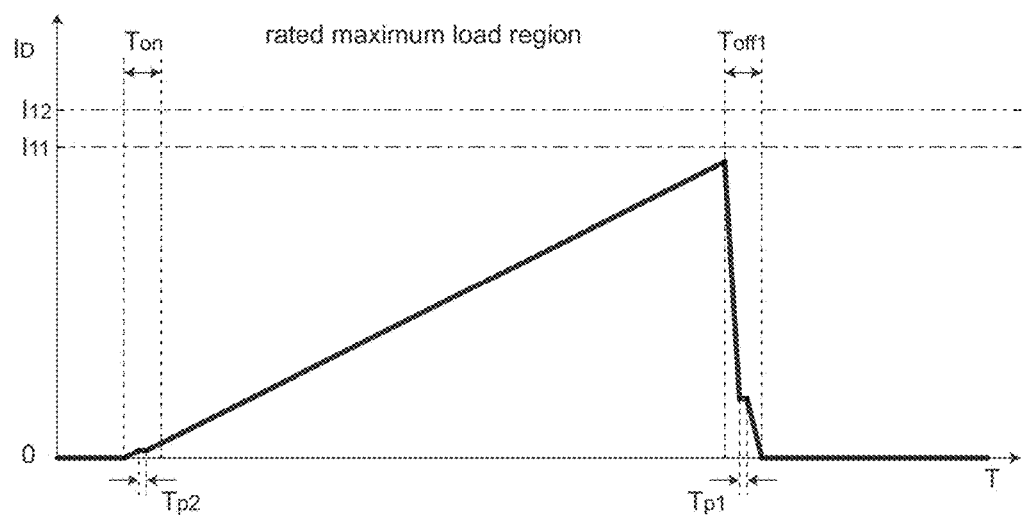
FIGS. 6A to 6C are views schematically showing a waveform of the drain current $I_D$ at the time of performing the switching operation in a case where a plurality of voltage levels $I_{11}$, $I_{12}$ are set as a first set current $I_1$ in the switching power source device 1 according to the embodiment 1.
Figure 6B:
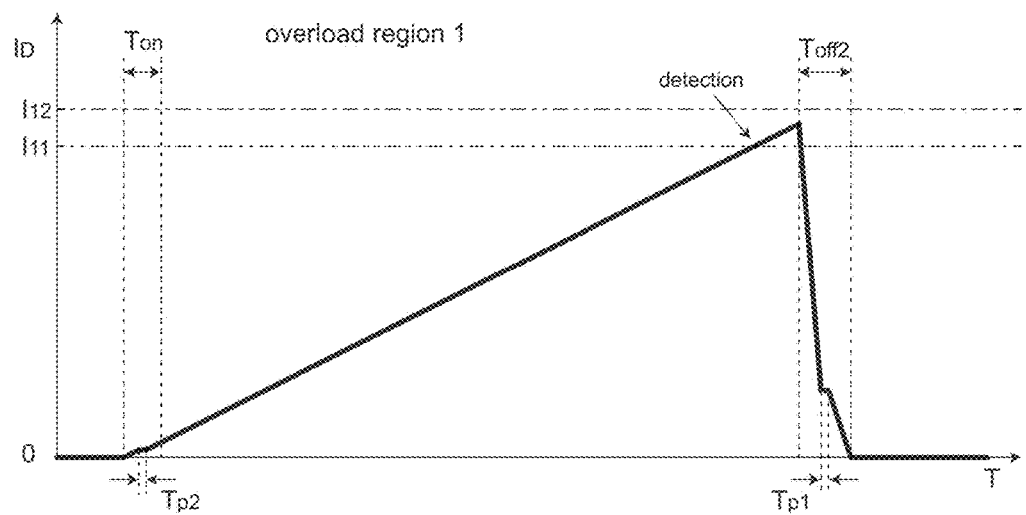
Figure 6C:
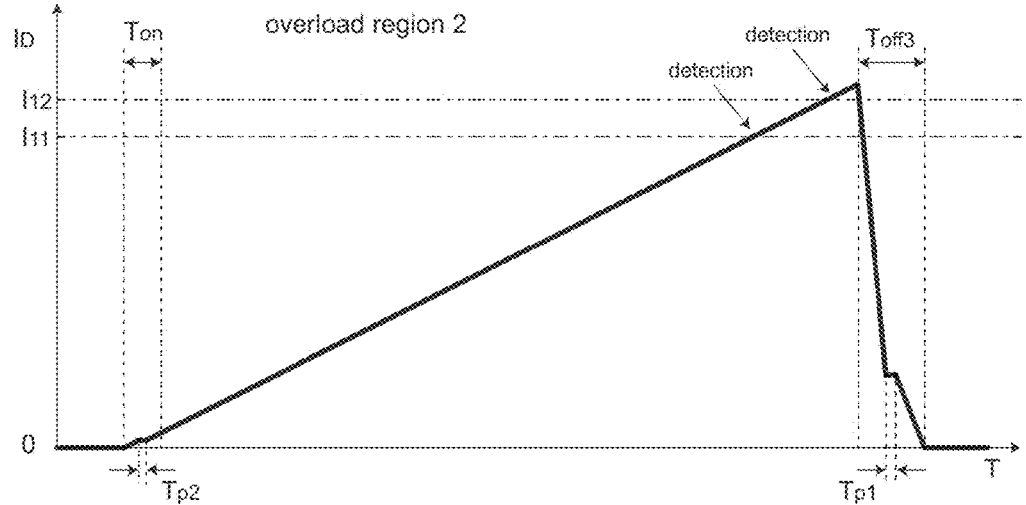

FIGS. 6A to 6C are views schematically showing waveforms of drain currents $I_D$ at the time of a switching operation when a plurality of voltage levels $I_{11}, I_{12}$ are set as a first set current $I_1$ in the switching power source device 1 according to the embodiment 1. FIG. 6A shows a waveform of a drain current $I_D$ in the rated maximum load region, FIG. 6B shows a waveform of a drain current $I_D$ in the overload region 1, and FIG. 6C shows a waveform of a drain current $I_D$ in the overload region 2.

Figure 7:
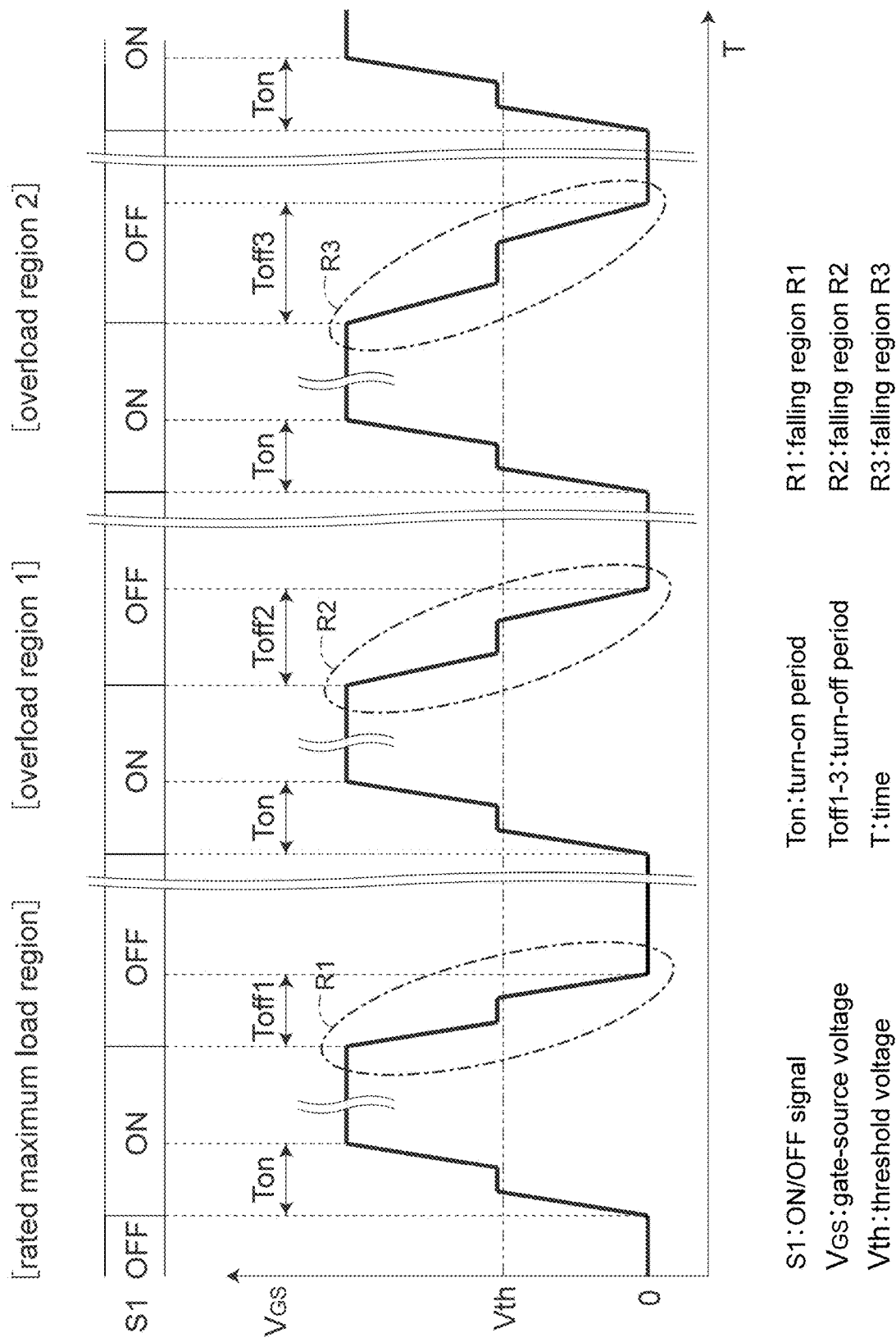
FIG. 7 is a view schematically showing a waveform of the gate voltage $V_{GS}$ at the time of performing the switching operation in a case where a plurality of voltage levels $I_{11}$, $I_{12}$ are set as a first set current $I_1$ in the switching power source device 1 according to the embodiment 1.

FIG. 7 is a view schematically showing waveforms of gate voltages $V_{GS}$ at the time of performing a switching operation when the plurality of voltage levels $I_{11}, I_{12}$ are set as a first set current $I_1$ in the switching power source device 1 according to the embodiment 1. In the drawing, the waveform of the gate voltage $V_{GS}$ on the most left side is the waveform of the gate voltage $V_{GS}$ in the rated maximum load region, the waveform of the second gate voltage $V_{GS}$ as counted from the left side is the waveform of the gate voltage $V_{GS}$ in the overload region 1, and the waveform of the third gate voltage $V_{GS}$ as counted from the left side is the waveform of the gate voltage $V_{GS}$ in the overload region 2.

In the semiconductor switch control circuit 12 according to the embodiment 1, as shown in FIGS. 6A to 6C, the drive current control part 19 can set a plurality of current levels ($I_{11}$ to $I_{12}$) as the first set current $I_1$ and may control a drive current such that a falling speed of the gate voltage $V_{GS}$ is lowered in a stepwise manner in accordance with a phenomenon that the drain current $I_D$ exceeds the higher voltage level among the plurality of current levels (described as Toff3>Toff2>Toff1 in FIGS. 6A to 6C and FIG. 7). With such a configuration, the falling speed of the gate voltage can be properly controlled corresponding to a degree of danger that self-oscillation is generated and hence, it is possible to acquire a necessary self-oscillation suppressing effect without unnecessarily prolonging a turn-off period.

As shown in FIGS. 6A to 6C, as the plurality of current levels, for example, two current levels can be set. However, the present invention is not limited to such a case and, for example, three or more current levels can be set. As values of the plurality of current levels, appropriate values can be set so as to be able to properly control a falling speed of the gate voltage corresponding to a degree of danger that the self-oscillation is generated.

2. Advantageous Effects of the Semiconductor Switch Control Circuit 12 and Switching Power Source Device 1 According to Embodiment 1

The semiconductor switch control circuit 12 according to the embodiment 1 includes the drive current control part 19 which controls a drive current which the drive current generating part 14 generates based on a pulse signal which the pulse signal generating part 13 generates and a current which the current detecting part 18 detects. Accordingly, by controlling a drive current such that a falling speed of a gate voltage is lowered (becomes slow) at the timing that a large switching current flows such as at the time of starting the power source or at the time that an overload is applied (see FIG. 4 and FIG. 7), it is possible to provide the semiconductor switch control circuit and the switching power source device which minimally cause a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied (see FIG. 5).

Further, in the semiconductor switch control circuit according to the embodiment 1, the drive current generating part 14 includes the source part 15 which charges a current to the gate electrode of the semiconductor switch 6 and the sink part 16 which discharges a current from the gate electrode of the semiconductor switch 6. The drive current control part 19 controls a drive current by controlling the discharge current discharged from the gate electrode of the semiconductor switch 6. Accordingly, it is possible to control a drive current to a suitable value such that a falling speed of a gate voltage or a rising speed of the gate voltage is lowered (becomes slow) at the timing that a large switching current flows such as at the time of starting the power source or at the time that an overload is applied.

According to the semiconductor switch control circuit 12 of the embodiment 1, when the current detected by the current detecting part 18 exceeds the predetermined first set current $I_1$, the drive current control part 19 controls a drive current such that a falling speed of the gate voltage during a turn-off period of the semiconductor switch 6 becomes lower than a falling speed of the gate voltage before detection of the current by the current detecting part 18 which exceeds the predetermined first set current $I_1$. Accordingly, it is possible to acquire a sufficient self-oscillation suppressing effect at the time of turning off the semiconductor switch 6 where self-oscillation is liable to be generated.

In the semiconductor switch control circuit 12 according to the embodiment 1, the drive current control part 19 can set a plurality of current levels as the first set current $I_1$ and control a drive current such that a falling speed of the gate voltage $V_{GS}$ is lowered in a stepwise manner in accordance with a phenomenon that the current detecting part 18 detects a current which exceeds the larger current level among the plurality of current levels and hence, the falling speed of the gate voltage can be properly controlled corresponding to a degree of danger that self-oscillation is generated and hence, it is possible to acquire a necessary self-oscillation suppressing effect without unnecessarily prolonging a turn-off period.

According to the semiconductor switch control circuit 12 of the embodiment 1, the semiconductor switch 6 is formed of a wide gap semiconductor (for example, silicon carbide, gallium nitride, gallium oxide, diamond or the like) and hence, it is possible to realize the acquisition of high efficiency and miniaturization of the device due to characteristics of the wide gap semiconductor such as low ON resistance and high speed switching.

Modifications of Embodiment 1

Figure 8:
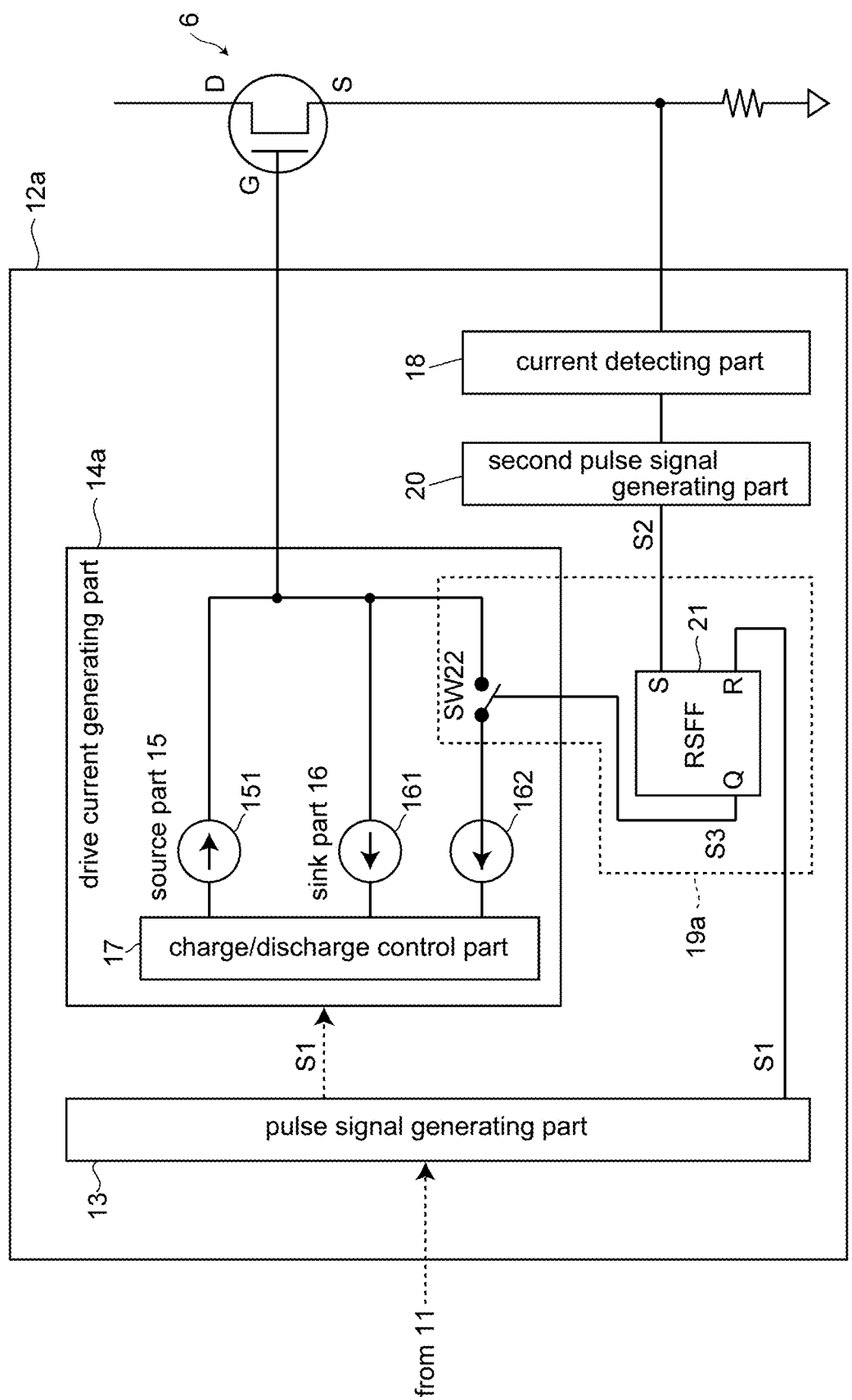
FIG. 8 is a view for describing a semiconductor switch control circuit 12a according to a modification 1 of the embodiment 1.
Figure 9:
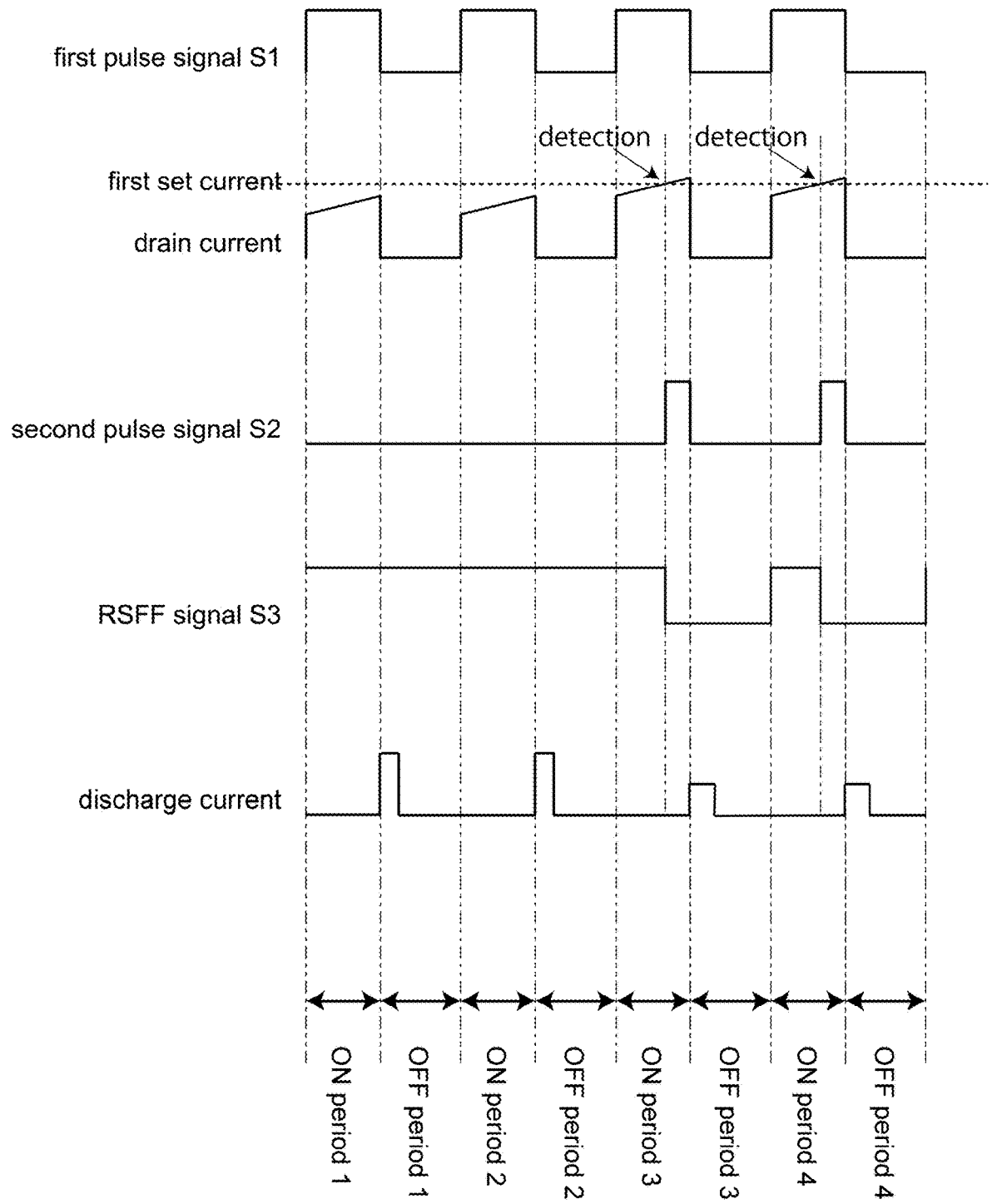
FIG. 9 is a view for showing various kinds of waveforms in the semiconductor switch control circuit 12a according to the modification 1 of the embodiment 1.
Figure 10:
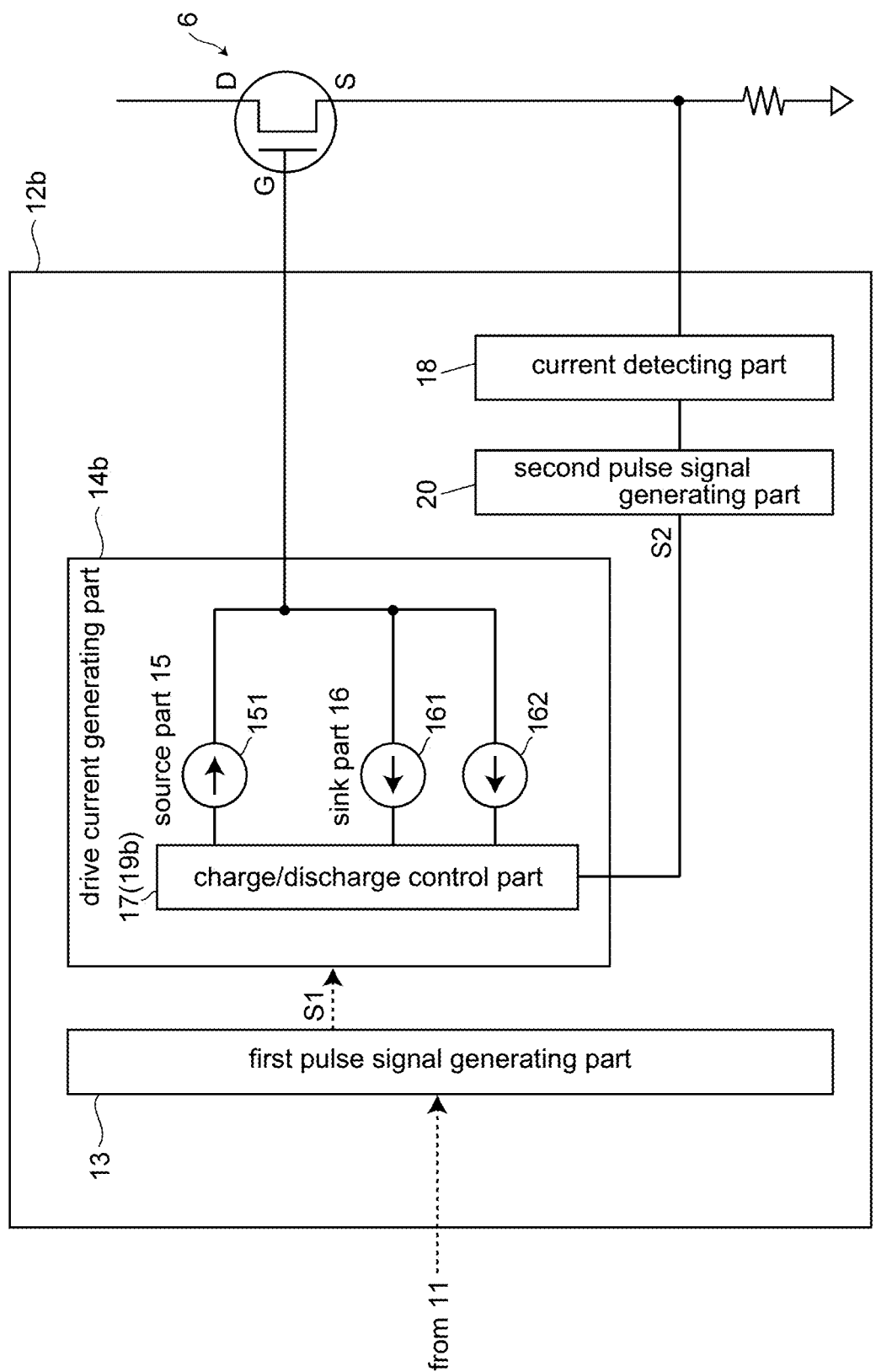
FIG. 10 is a view for describing a semiconductor switch control circuit 12b according to a modification 2 of the embodiment 1.
Figure 11:
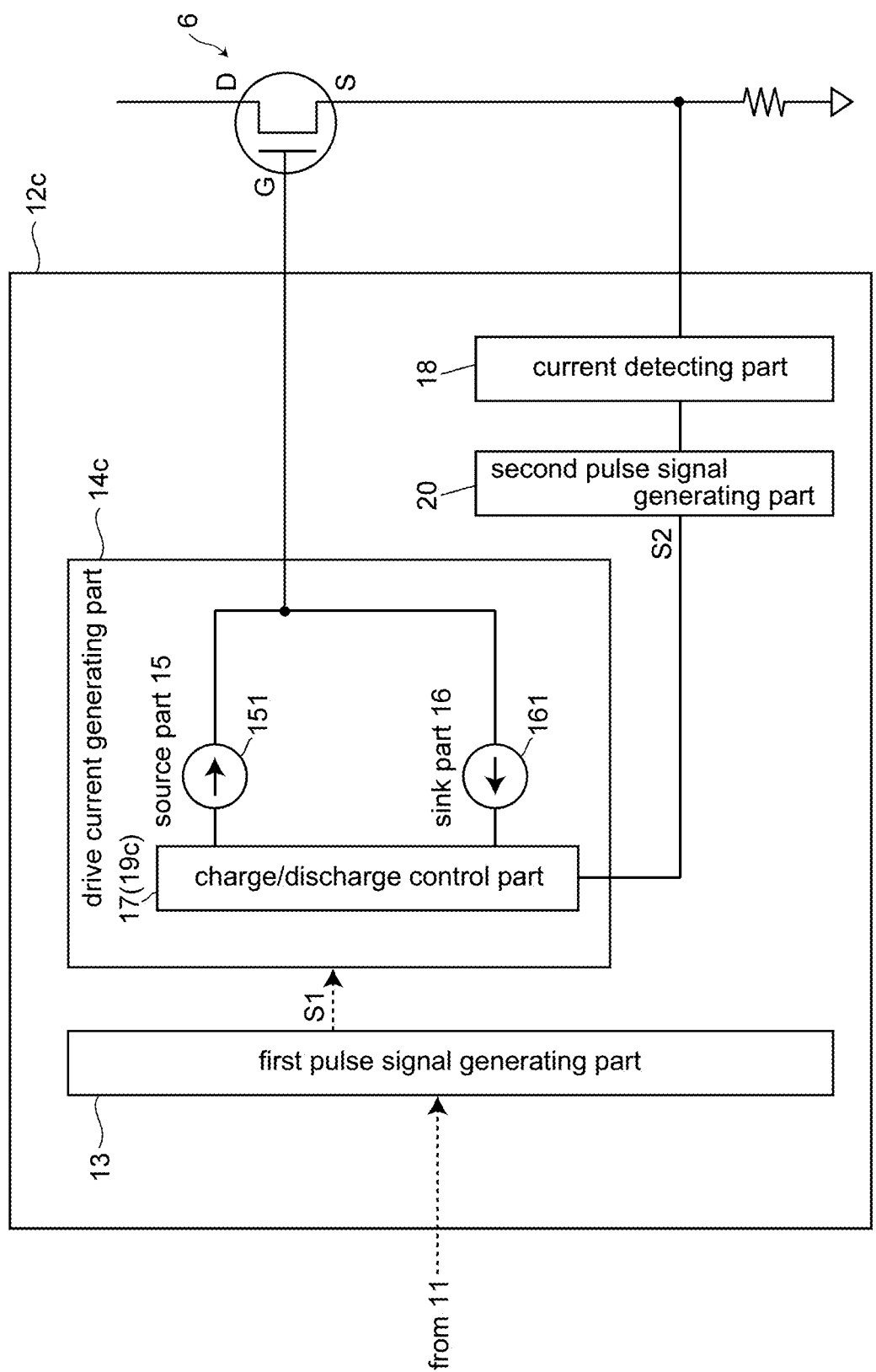
FIG. 11 is a view for describing a semiconductor switch control circuit 12c according to a modification 3 of the embodiment 1.

FIG. 8 is a view for describing a semiconductor switch control circuit 12a according to a modification 1 of the embodiment 1. FIG. 9 is a view showing various kinds of waveforms in the semiconductor switch control circuit 12a according to the modification 1 of the embodiment 1. FIG. 10 is a view for describing a semiconductor switch control circuit 12b according to a modification 2 of the embodiment 1. FIG. 11 is a view for describing a semiconductor switch control circuit 12c according to a modification 3 of the embodiment 1.

In the present invention, as in the case of the semiconductor switch control circuit 12a shown in FIG. 8, the semiconductor switch control circuit 12b shown in FIG. 10, and the semiconductor switch control circuit 12c shown in FIG. 11, the semiconductor control circuit may further include a second pulse signal generating part 20 which generates a second pulse signal when a current which a current detecting part 18 detects exceeds a first set current, and a drive current control part 19a, 19b, 19c may control a drive current based on a second pulse signal S2 which the second pulse signal generating part 20 generates.

Among the above-mentioned semiconductor switch control circuits 12a, 12b, 12c, with respect to the semiconductor switch control circuit 12a according to the modification 1 of the embodiment 1, a sink part 16 includes a plurality of discharge current paths (discharge current sources 161, 162) which are connected in parallel to each other. The drive current control part 19a includes: an R terminal into which a pulse signal S1 from a pulse signal generating part 13 is inputted; an S terminal into which a second pulse signal S2 from the second pulse signal generating part 20 is inputted; and a Q terminal from which a control signal (RSFF signal) S3 for controlling a discharge current is outputted. The drive current control part 19a also includes an RS flip-flop 21 which outputs an RSFF signal S3 for stopping a discharge operation on at least one discharge current path out of the plurality of discharge current paths from the Q terminal at the time of turning off the semiconductor switch 6 following an ON period when a second pulse signal S2 is inputted from the second pulse signal generating part 20 during the ON period. With such a configuration, a current amount of a current which flows through the sink part 16 is decreased based on the second pulse signal S2. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied.

The manner of operation of the semiconductor switch control circuit 12a according to the embodiment 1 is described with reference to FIG. 9. As can be also understood from FIG. 9, during an ON period (ON periods 1 to 4), a first pulse signal S1 outputted from the pulse signal generating part 13 becomes H so that the semiconductor switch 6 is turned on whereby a drain current flows through the semiconductor switch 6. At this stage of the operation, when the drain current exceeds a predetermined threshold current (first set current $I_1$), the second pulse signal generating part 20 generates a second pulse signal S2. As a result, an RSFF signal S3 outputted from the RS flip-flop 21 becomes L and hence, a switch SW22 is brought into an open state. Accordingly, at the time of turning off the semiconductor element 6 following the ON period, a current (a discharge current, and also referred to as a sink current) from one discharge current source 162 out of two discharge current sources 161, 162 of the sink part 16 is not supplied to a gate electrode. Accordingly, as a whole, a current amount of a discharge current supplied to the gate electrode is decreased and hence, a falling speed of a gate voltage $V_{GS}$ at the time of turning off the semiconductor switch 6 is lowered. Accordingly, a surge voltage at the time of turning off the semiconductor switch is decreased and hence, an undesired oscillation phenomenon of a gate voltage $V_{GS}$ or a drain current is reduced (see a waveform of the gate voltage in an overload region in FIG. 5) whereby breaking or deterioration of the semiconductor switch can be prevented also under an operation condition such as at the time starting a power source or at the time of occurrence of an over current. Further, in this case, a discharge current is decreased only in the case where the semiconductor switch is turned off under an operation condition such as at the time of starting a power source or at the time of occurrence of an over current and hence, there is no concern that the power conversion efficiency is lowered in a normal load mode.

Among the above-mentioned semiconductor switch control circuits 12a, 12b, 12c, with respect to the semiconductor switch control circuit 12b according to the modification 2 of the embodiment 1, as shown in FIG. 10, a sink part 16 includes a plurality of discharge current paths (discharge current sources 161, 162) which are connected in parallel to each other. A drive current control part 19b includes a charge/discharge control part 17 which stops a discharge operation on at least one discharge current path out of the plurality of discharge current paths at the time of turning off a semiconductor switch 6 following an ON period when a second pulse signal S2 is inputted from a second pulse signal generating part during the ON period. Also with such a configuration, a current amount of a current which flows through the sink part 16 is decreased based on the second pulse signal S2. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting a power source or at the time that an overload is applied.

The plurality of discharge current paths may respectively have different discharge abilities. With such a configuration, a falling speed of a gate voltage can be adjusted in a wide range.

Among the above-mentioned semiconductor switch control circuits 12a, 12b, 12c, with respect to the semiconductor switch control circuit 12c according to the modification 3 of the embodiment 1, as shown in FIG. 11, a drive current control part 19c may include a charge/discharge control part 17 which, when a second pulse signal S2 from the second pulse signal generating part 20 is inputted during an ON period, decreases a current amount of a current which flows through the sink part 16 in an analogue manner at the time of turning off a semiconductor switch 6 following the ON period. Also with such a configuration, a current amount of a current which flows through the sink part 16 is decreased based on a second pulse signal S2. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting a power source or at the time that an overload is applied. In such an operation, "decreases in an analogue manner" means that a current amount is decreased to a desired current amount such that a falling speed during a turn-off period becomes a predetermined speed.

Embodiment 2

In the embodiment 1, it has been described that the semiconductor switch control circuit according to the present invention is a semiconductor switch control circuit which minimally generates self-oscillation at the time of turning off the semiconductor switch. However, the semiconductor switch control circuit according to the present invention also becomes a semiconductor switch control circuit which minimally generates self-oscillation at the time of turning on the semiconductor switch. In this case, it is particularly effective when the semiconductor switch control circuit is applied to a switching power source device where self-oscillation is liable to be generated at the time of turning on the semiconductor switch (for example, a switching power source device formed of a continuous-type step-up chopper).

Figure 12A:
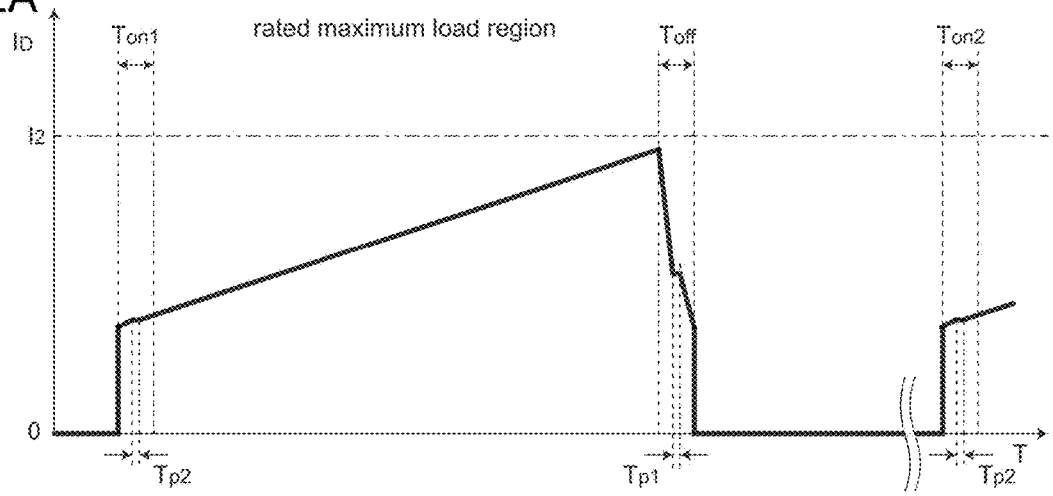
FIGS. 12A to 12C are views schematically showing a waveform of a drain current $I_D$ at the time of performing a switching operation in the switching power source device according to an embodiment 2.
Figure 12B:
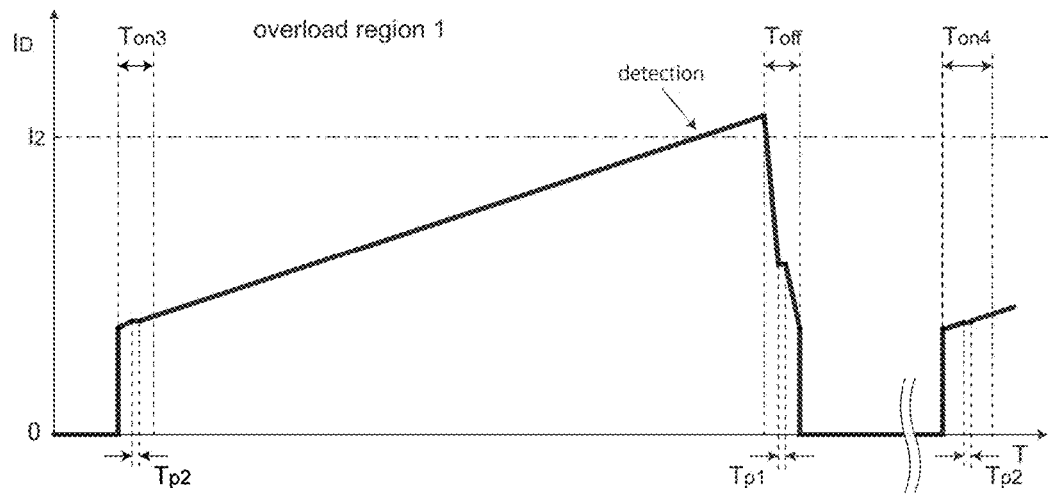
Figure 12C:
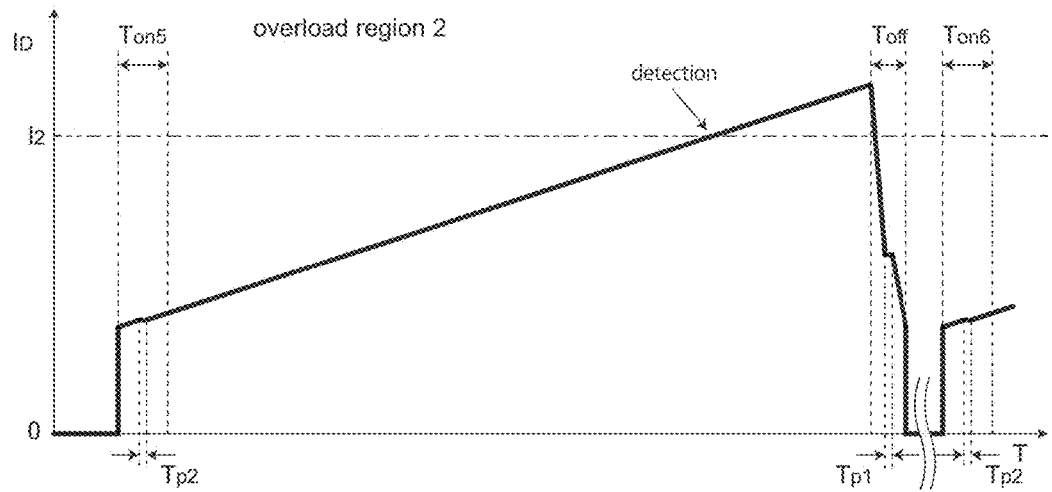

FIGS. 12A to 12C are views schematically showing waveforms of a drain current $I_D$ at the time of performing a switching operation in the switching power source device according to the embodiment 2. FIG. 12A shows a waveform of a drain current $I_D$ in a rated maximum load region, FIG. 12B shows a waveform of a drain current $I_D$ in an overload region 1, and FIG. 12C shows a waveform of a drain current $I_D$ in an overload region 2.

Figure 13:
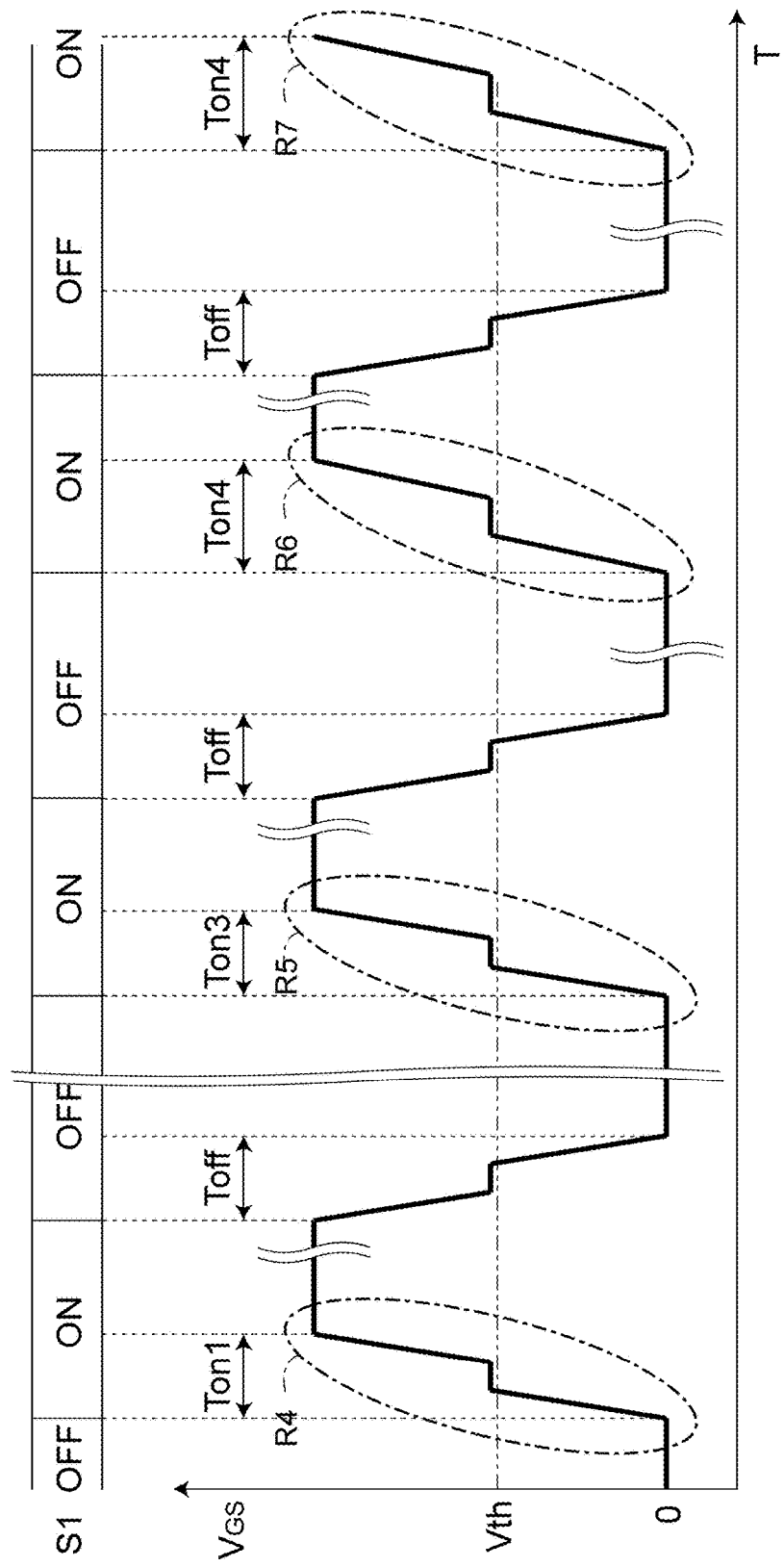
FIG. 13 is a view schematically showing a waveform of a gate voltage $V_{GS}$ at the time of performing the switching operation in the switching power source device according to the embodiment 2.

FIG. 13 is a view schematically showing a waveform of a gate voltage $V_{GS}$ at the time of performing a switching operation in the switching power source device according to the embodiment 2. In the drawing, the waveform of the gate voltage $V_{GS}$ on the most left side is the waveform of the gate voltage $V_{GS}$ in a rated maximum load region, the waveform of the second gate voltage $V_{GS}$ as counted from the left side and the waveform of the third gate voltage $V_{GS}$ as counted from the left side are the waveforms of the gate voltage $V_{GS}$ in the overload region 1.

Figure 14:
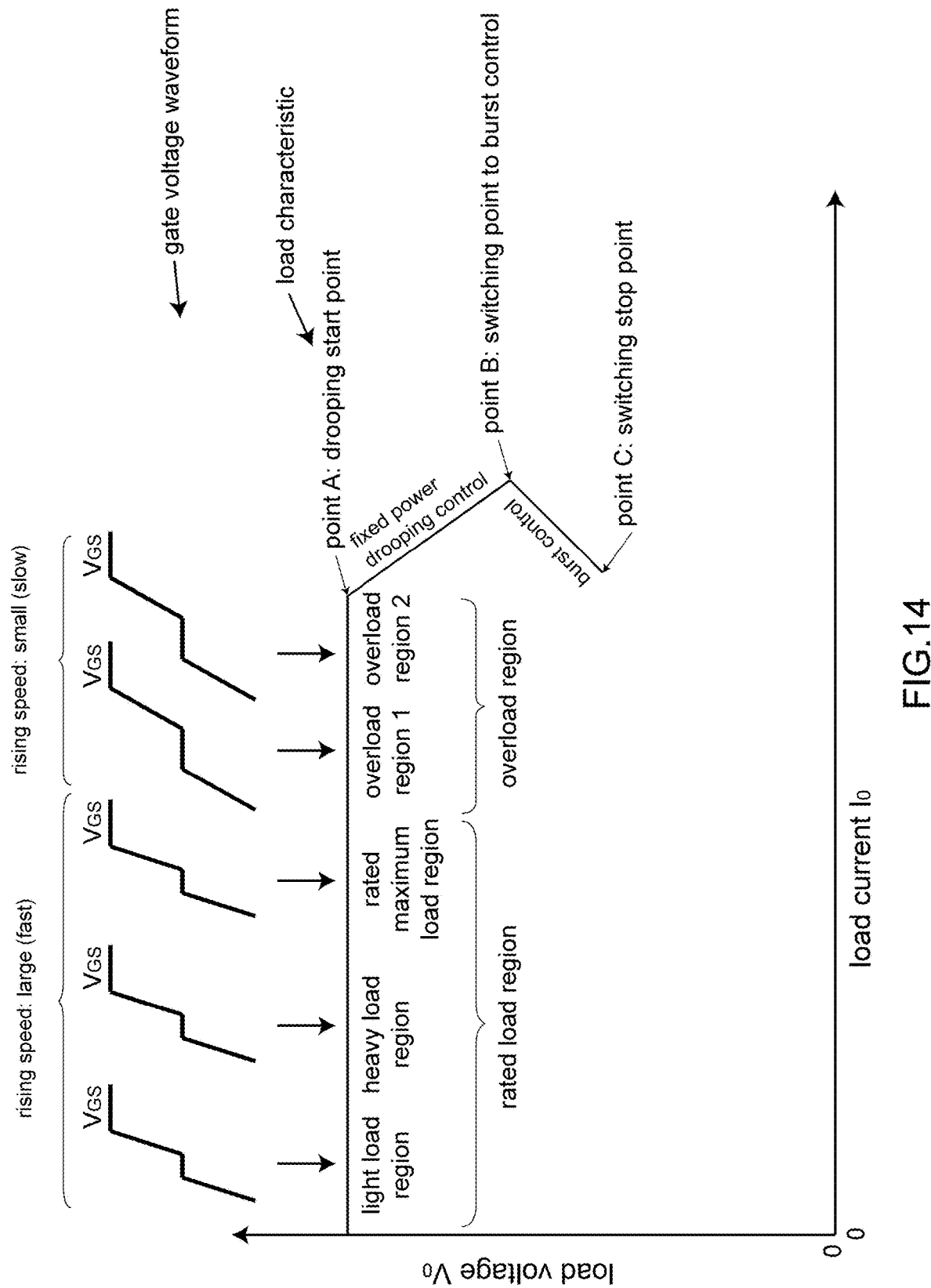
FIG. 14 is a view schematically showing a waveform of a gate voltage $V_{GS}$ at the time of turning on a semiconductor switch 6 in the switching power source device according to the embodiment 2 for every load region together with a load characteristic diagram.

FIG. 14 is a view schematically showing the waveform of a gate voltage $V_{GS}$ at the time of turning off the semiconductor switch 6 in the switching power source device according to the embodiment 2 for every load region together with a load characteristic diagram. In the drawing, the waveform of the gate voltage $V_{GS}$ on the most left side is the waveform of the gate voltage $V_{GS}$ in a light load region, the waveform of the second gate voltage $V_{GS}$ as counted from the left side is the waveform of the gate voltage $V_{GS}$ in a heavy load region, and the waveform of the third gate voltage $V_{GS}$ as counted from the left side is the waveform of the gate voltage $V_{GS}$ in the rated maximum load region, the waveform of the fourth gate voltage $V_{GS}$ as counted from the left side is the waveform of the gate voltage $V_{GS}$ in the overload region 1, and the waveform of the fifth gate voltage $V_{GS}$ as counted from the left side is the waveform of the gate voltage $V_{GS}$ in an overload region 2.

In the semiconductor switch control circuit according to the embodiment 2, the drive current control part, when a current which the current detecting part detects exceeds a predetermined second set current $I_2$ (see FIG. 12A), controls a drive current such that a rising speed of a gate voltage $V_{GS}$ during an turn-on period of the semiconductor switch 6 becomes lower than the corresponding rising speed before detection of the current by the current detecting part which exceeds the predetermined second set current $I_2$ (see FIGS. 12A to 12C and see FIG. 13). Accordingly, as can be also understood from FIGS. 12A to 12C and FIG. 13, a rising speed in the turn-on period Ton4 in the overload region 1 (after the detection) and a rising speed in the turn-on periods Ton5, Ton6 in the overload region 2 become slower than a rising speed during the turn-on periods Ton1, Ton2 in the rated maximum load region and a rising speed in the turn-on period Ton3 in the overload region 1 (before the detection). Further, corresponding to such setting of the rising speeds, the turn-on period Ton4 in the overload region 1 (after the detection) and the turn-on periods Ton5, Ton6 in the overload region 2 become longer than the turn-on periods Ton1, Ton2 in the rated maximum load region and the turn-on period Ton3 in the overload region 1 (before the detection) (in this case, Ton4=Ton5=Ton6>Ton1=Ton2=Ton3). The second set current $I_2$ may have a value different from a value of the first set current or may have the same value as the first set current.

The generation of the self-oscillation at the time of turning on the semiconductor switch 6 starts when the load goes beyond the rated maximum load region and falls in the overload region 1, and is increased when the load falls in the overload region 2. In such an operation, when the situation is left as it is, the self-oscillation is extremely increased as in the case of turning off the semiconductor switch 6 thus giving rise to a case where a semiconductor switch is erroneously operated due to such self-oscillation so that the semiconductor switch or a circuit part around the semiconductor switch is broken. To the contrary, in the semiconductor switch control circuit according to the embodiment 2, when the load falls in the overload region 1 (when the drain current $I_D$ exceeds the second set current $I_2$), a drive current is controlled such that a rising speed of the gate voltage $V_{GS}$ becomes lower than the rising speed before detection of the drain current $I_D$ by the current detecting part which exceeds the second set current $I_2$ and hence, the self-oscillation is suppressed. As a result, it is possible to maintain the self-oscillation at a small level where an erroneous operation of the semiconductor switch 6 is not induced (see the waveform of the gate voltage $V_{GS}$ in the overload region 1 and the overload region 2 shown in FIG. 13 and FIG. 14).

In the semiconductor switch control circuit according to the embodiment 2, assume a case where a drain current $I_D$ which the current detecting part detects exceeds the second set current $I_2$ during the ON period. In such a case, a falling speed is lowered (becomes slow) during the turn-on period during the next ON period after the ON period and hence, a control of the drive current control part 19 can be performed at a speed which is not so high (see FIGS. 12A to 12C).

A second set current $I_2$ is set to a value which exceeds a current range of a drain current (or a source current) in a rated maximum load region. In a case where the second set current $I_2$ is set to a value slightly larger than the rated maximum load region, although a self-oscillation suppressing effect is increased, a turn-on period is unnecessarily prolonged and a switching speed becomes excessively slow. Accordingly, such setting of the second set current $I_2$ is not desirable. On the other hand, in a case where the second set current $I_2$ is set to a value considerably larger than the rated maximum load, a self-oscillation suppressing effect cannot be sufficiently acquired. Accordingly, such setting of the second set current $I_2$ is not desirable. From this point of view, it is preferable to set the second set current $I_2$ to a value which takes into account the self-oscillation suppressing effect and the turn-off period.

Figure 15A:
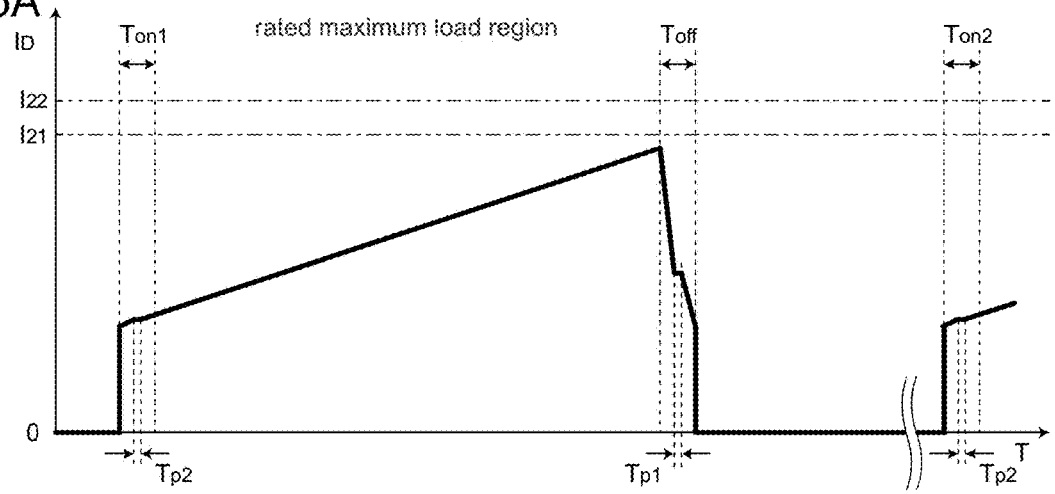
FIGS. 15A to 15C are views schematically showing a waveform of the current $I_D$ at the time of performing the switching operation in a case where a plurality of voltage levels $I_{21}$, $I_{22}$ are set as a second set current $I_2$ in the switching power source device according to the embodiment 2.
Figure 15B:
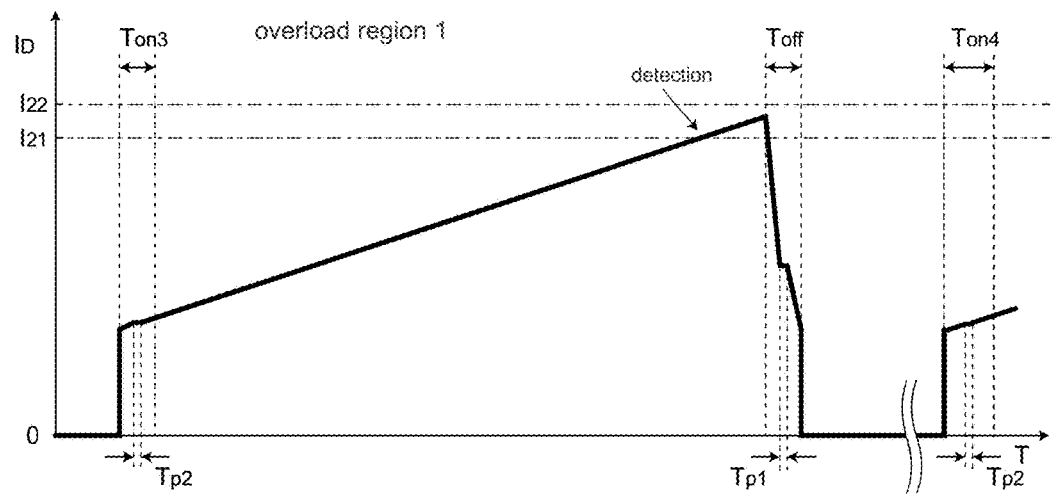
Figure 15C:
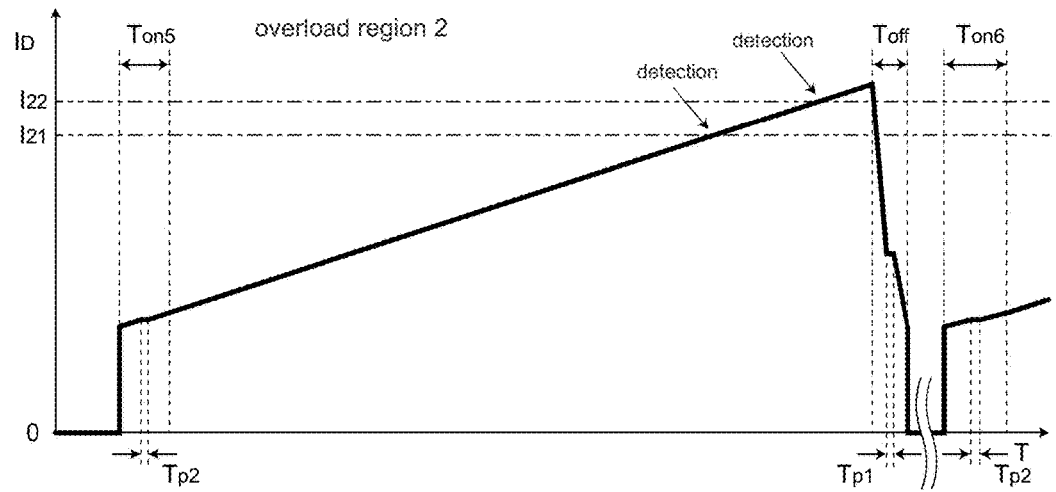

FIGS. 15A to 15C are views schematically showing the waveform of the drain current $I_D$ at the time of performing the switching operation in a case where a plurality of voltage levels 121, 122 are set as a second set current $I_2$ in the switching power source device according to the embodiment 2.

Figure 16:
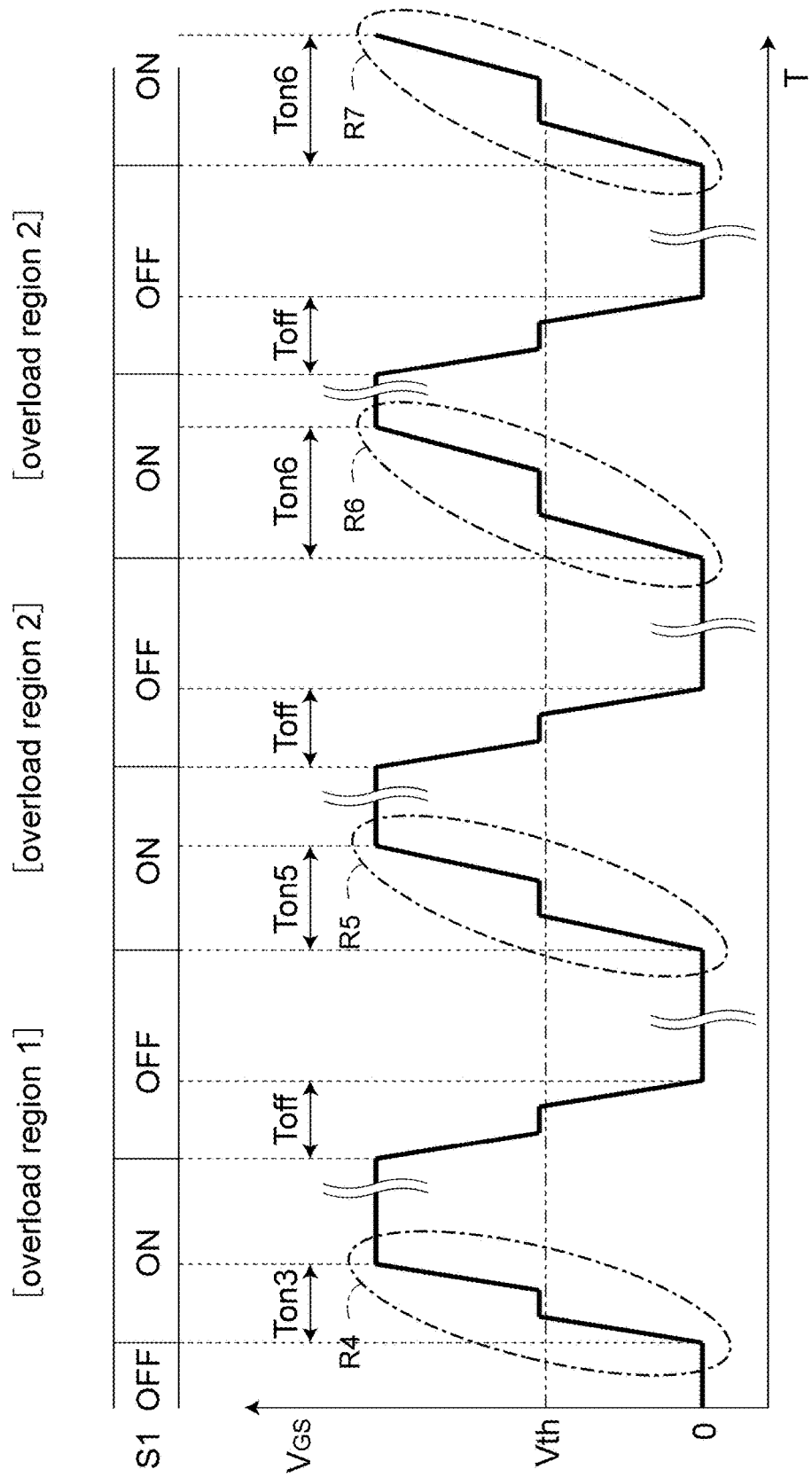
FIG. 16 is a view schematically showing the waveform of the gate voltage $V_{GS}$ at the time of performing the switching operation in a case where a plurality of voltage levels $I_{21}$, $I_{22}$ are set as the second set current $I_2$ in the switching power source device according to the embodiment 2.

FIG. 15A shows a waveform of a drain current $I_D$ in a rated maximum load region, FIG. 15B shows a waveform of the drain current $I_D$ in an overload region 1, and FIG. 15C shows a waveform of the drain current $I_D$ in an overload region 2. FIG. 16 is a view schematically showing a waveform of a gate voltage $V_{GS}$ at the time of performing a switching operation when a plurality of voltage levels 121, 122 are set as a second set current $I_2$ in the switching power source device according to the embodiment 2. In the drawing, the waveform of the gate voltage $V_{GS}$ on the most left side is the waveform of the gate voltage $V_{GS}$ in the overload region 1, and the waveform of the second gate voltage $V_{GS}$ as counted from the left side and the waveform of the third gate voltage $V_{GS}$ as counted from the left side are the waveforms of the gate voltages $V_{GS}$ in the overload region 2.

In the semiconductor switch control circuit according to the embodiment 2, as shown in FIGS. 15A to 15C, the drive current control part can set a plurality of current levels ($I_{21}$ to $I_{22}$) as the second set current $I_2$ and may control a drive current such that a rising speed of the gate voltage $V_{GS}$ is lowered in a stepwise manner in accordance with a phenomenon that the drain current $I_D$ exceeds the higher voltage level among the plurality of current levels (described as Ton6>Ton4>Ton2 in FIGS. 12A to 12C and FIG. 13). With such a configuration, the rising speed of the gate voltage can be properly controlled corresponding to a degree of danger that self-oscillation is generated and hence, it is possible to acquire a necessary self-oscillation suppressing effect without unnecessarily prolonging a turn-on period.

As shown in FIGS. 15a to 15C, as the plurality of voltage levels, for example, two current levels can be set. However, the present invention is not limited to such a case and, for example, three or more current levels can be set. As values of the plurality of current levels, appropriate values can be set so as to properly control a rising speed of the gate voltage corresponding to a degree of danger that the self-oscillation is generated.

Semiconductor switch control circuit according to the embodiment 2 acquires the following advantageous effects in addition to advantageous effects substantially equal to the advantageous effects acquired by the semiconductor switch control circuit 12 according the embodiment 1.

That is, according to the semiconductor switch control circuit of the embodiment 2, the drive current control part controls a drive current such that a rising speed of a gate voltage during a turn-on period of the semiconductor switch becomes lower than the rising speed of the gate voltage before the detection when a current which a current detecting part detects exceeds a predetermined second set current $I_2$. Accordingly, it is possible to acquire a sufficient self-oscillation suppressing effect also at the time of turning on the semiconductor switch.

Further, according to the semiconductor switch control circuit of the embodiment 2, the drive current control part can set a plurality of current levels as the second set current $I_2$, and controls a drive current such that a rising speed of a gave voltage $V_{GS}$ is lowered in a stepwise manner in accordance with the detection of a current which exceeds a larger current level among a plurality of current levels. Accordingly, a rising speed of the gate voltage can be properly controlled corresponding to a degree of danger that self-oscillation is generated and hence, it is possible to acquire a necessary self-oscillation suppressing effect without unnecessarily prolonging a turn-on period.

Modification of Embodiment 2

Figure 17:
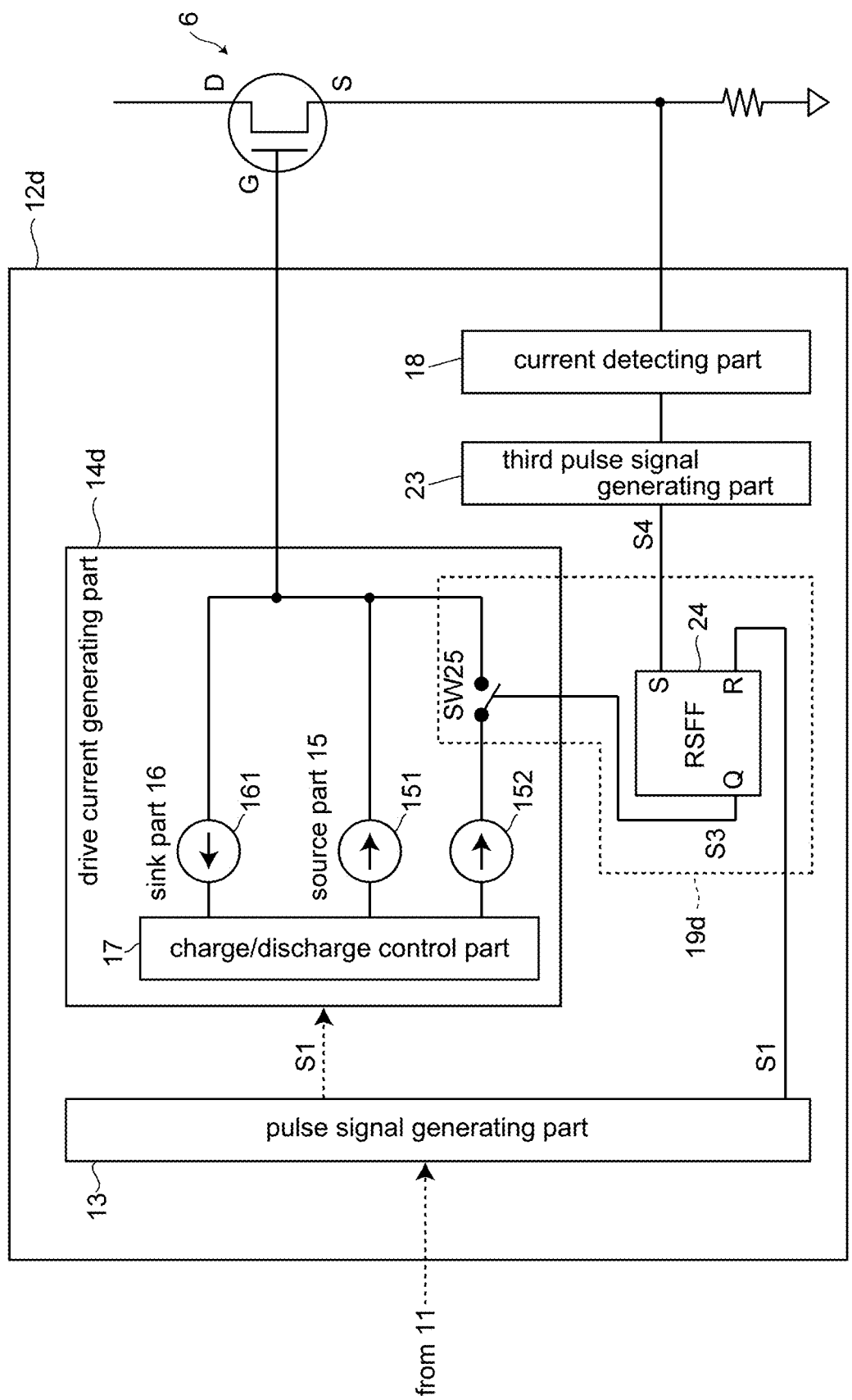
FIG. 17 is a view for describing a semiconductor switch control circuit 12d according to a modification 1 of the embodiment 2.
Figure 18:
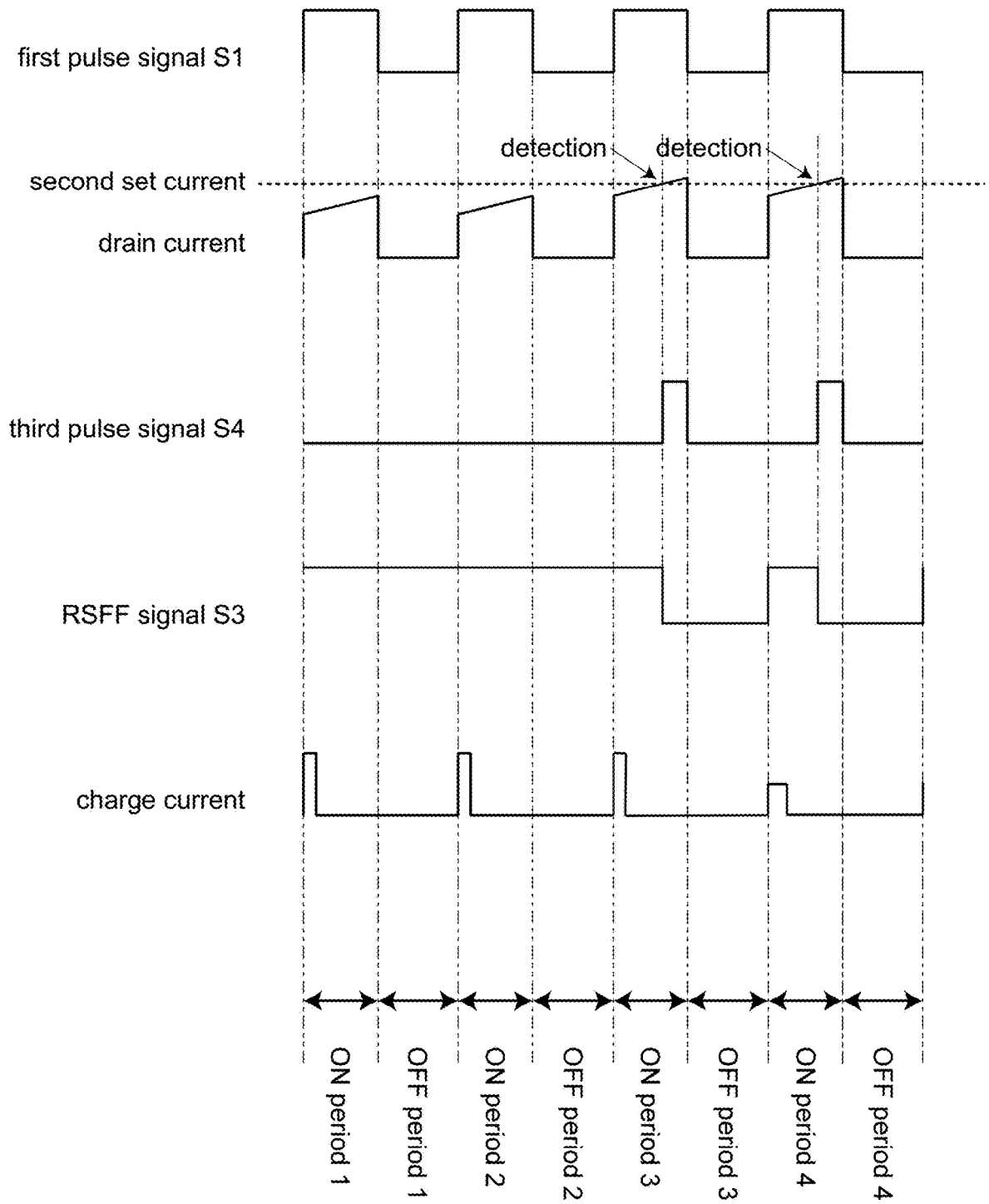
FIG. 18 is a view showing various kinds of waveforms in the semiconductor switch control circuit 12d according to the modification of the embodiment 2.
Figure 19:
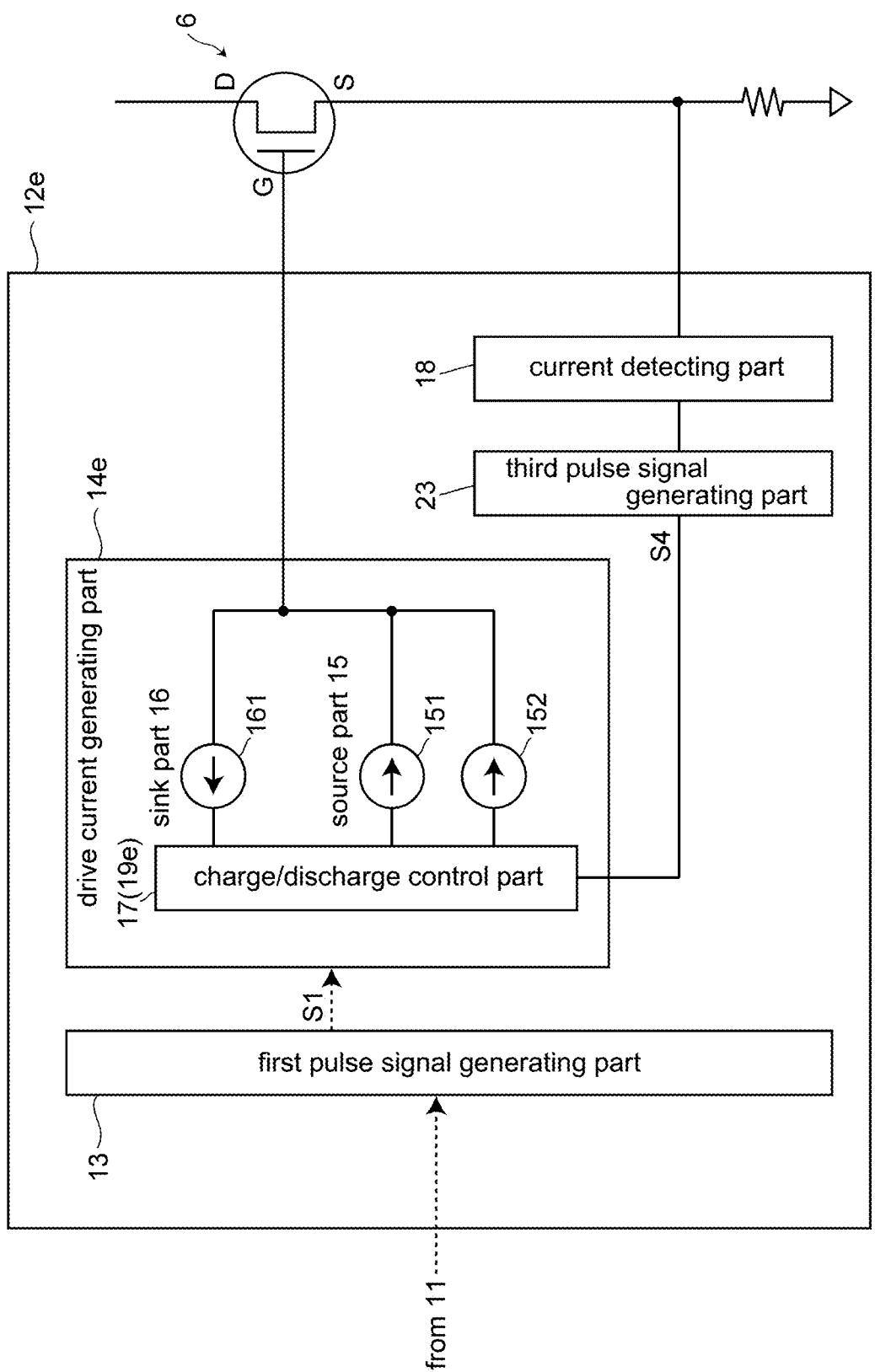
FIG. 19 is a view for describing a semiconductor switch control circuit 12e according to a modification 2 of the embodiment 2.
Figure 20:
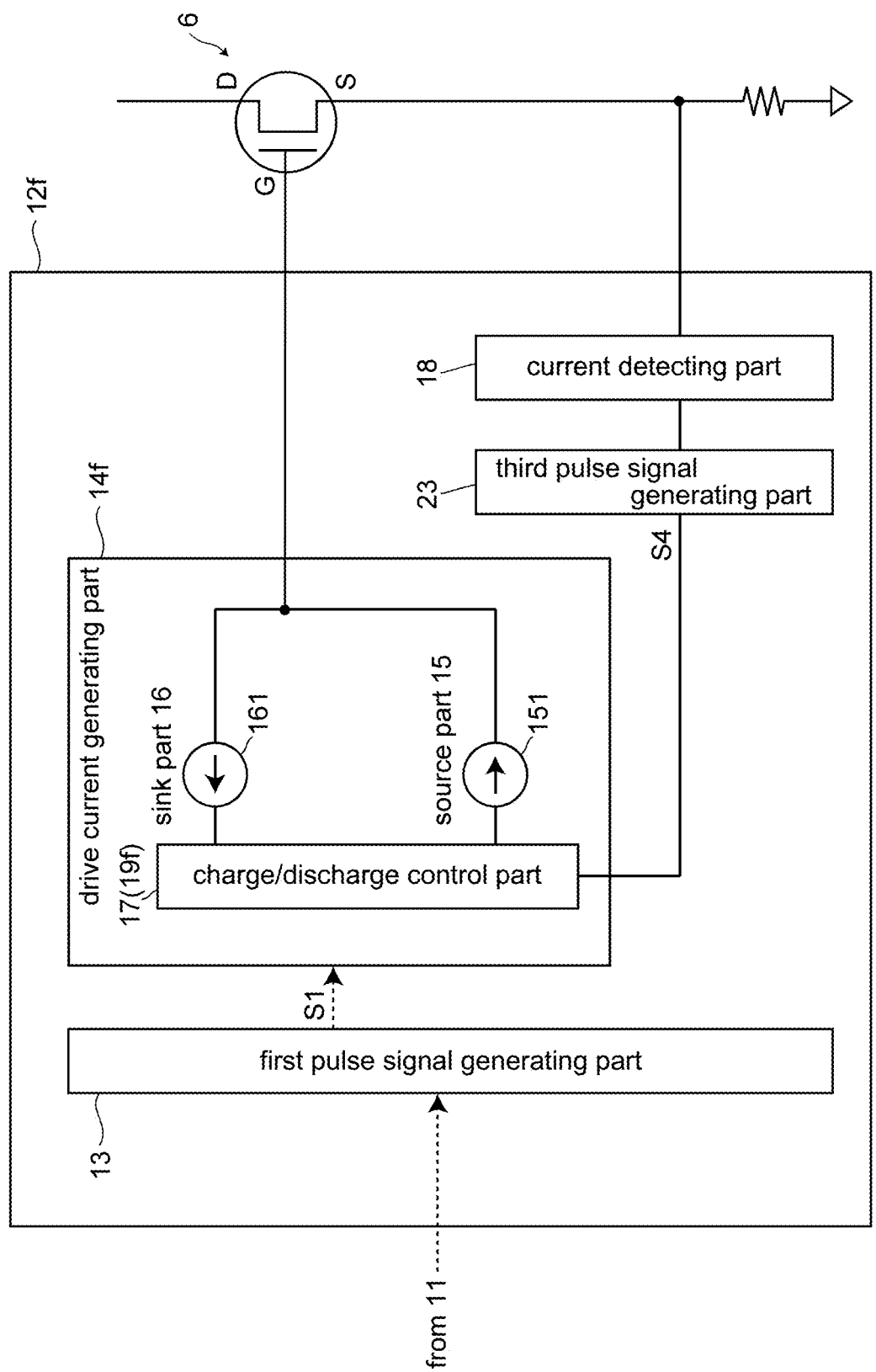
FIG. 20 is a view for describing a semiconductor switch control circuit 12f according to a modification 3 of the embodiment 2.

FIG. 17 is a view for describing a semiconductor switch control circuit 12d according to a modification 1 of the embodiment 2. FIG. 18 is a view for showing various kinds of waveforms in the semiconductor switch control circuit 12d according to the modification 1 of the embodiment 2. FIG. 19 is a view for describing a semiconductor switch control circuit 12e according to a modification 2 of the embodiment 2. FIG. 20 is a view for describing a semiconductor switch control circuit 12f according to a modification 3 of the embodiment 2.

In the present invention, as in the case of the semiconductor switch control circuit 12d shown in FIG. 17, the semiconductor switch control circuit 12e shown in FIG. 19, and the semiconductor switch control circuit 12f shown in FIG. 20, the semiconductor switch control circuit may further includes a third pulse signal generating part 23 which generates a third pulse signal when a current which the current detecting part 18 detects exceeds a second set current $I_2$, and the drive current control parts 19d, 19e, 19f may control a drive current based on a third pulse signal S4 which the third pulse signal generating part 23 generates.

Among the above-mentioned semiconductor switch control circuits 12d to 12f, with respect to the semiconductor switch control circuit 12d according to the modification 1 of the embodiment 2, a source part 15 includes a plurality of charge current paths (charge current sources 151, 152) which are connected in parallel to each other. The drive current control part 19d includes: an R terminal into which a pulse signal S1 from a pulse signal generating part 13 is inputted; an S terminal into which a third pulse signal S4 from a third pulse signal generating part 23 is inputted; and a Q terminal from which a control signal (RSFF signal) S3 for controlling a charge current is outputted. The drive current control part 19d also includes an RS flip-flop 24 which outputs an RSFF signal S3 for stopping a charge operation on at least one charge current path out of the plurality of charge current paths from the Q terminal at the time of turning on the semiconductor switch 6 during an ON period next to the ON period when a third pulse signal S4 is inputted from the third pulse signal generating part 23 during the ON period. With such a configuration, a current amount of a current which flows through the source part 15 is decreased based on a third pulse signal S4. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied.

The manner of operation of the semiconductor switch control circuit 12d according to the embodiment 2 is described with reference to FIG. 18. As can be also understood from FIG. 18, during an ON period (ON periods 1 to 4), a first pulse signal S1 outputted from the pulse signal generating part 13 becomes H so that the semiconductor switch 6 is turned on whereby a drain current flows through the semiconductor switch 6. At this stage of the operation, when the drain current exceeds a predetermined threshold current (second set current $I_2$), the third pulse signal generating part 23 generates a third pulse signal S4. As a result, an RSFF signal S3 outputted from the RS flip-flop 24 becomes L and hence, a switch SW25 is brought into an open state. Accordingly, at the time of turning on the semiconductor switch 6 during an ON period next to the ON period, a current (a charge current, and also referred to as a charge source current) from one charge current source 152 out of two charge current sources 151, 152 of the source part 15 is not supplied to a gate electrode. Accordingly, as a whole, a current amount of a charge current supplied to the gate electrode is decreased and hence, a rising speed of a gate voltage $V_{GS}$ at the time of turning on the semiconductor switch 6 is lowered. Accordingly, a surge voltage at the time of turning on the semiconductor switch 6 is decreased and hence, an undesired oscillation phenomenon of a gate voltage $V_{GS}$ or a drain current is reduced (see a waveform of the gate voltage in an overload region in FIG. 14) whereby breaking or deterioration of the semiconductor switch can be prevented also under an operation condition such as at the time of starting a power source or at the time of occurrence of an over current. Further, in this case, a charge current is decreased only in the case where the semiconductor switch is turned on under an operation condition such as at the time of starting a power source or at the time of occurrence of an over current and hence, there is no concern that the power conversion efficiency is lowered in a normal load mode.

Among the above-mentioned semiconductor switch control circuits 12d, 12e, 12f, with respect to the semiconductor switch control circuit 12e according to the modification 2 of the embodiment 2, as shown in FIG. 19, a source part 15 includes a plurality of charge current paths (charge current sources 151, 152) which are connected in parallel to each other. A drive current control part 19e includes a charge/discharge control part 17 which stops a charge operation on at least one charge current path out of the plurality of charge current paths at the time of turning on a semiconductor switch 6 during an ON period next to the ON period when a third pulse signal S4 is inputted from a third pulse signal generating part 23 during the ON period. Also with such a configuration, a current amount of a current which flows through the source part 15 is decreased based on a third pulse signal S4. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that a large switching current flows such as at the time of starting a power source or at the time that an overload is applied.

The plurality of charge current paths may respectively have different charge abilities. With such a configuration, a rising speed of a gate voltage can be adjusted in a wide range.

Among the above-mentioned semiconductor switch control circuits 12d, 12e, 12f, with respect to the semiconductor switch control circuit 12f according to the modification 3 of the embodiment 2, as shown in FIG. 20, a drive current control part 19f may include a charge/discharge control part 17 which, when a third pulse signal S4 from the third pulse signal generating part 23 is inputted during an ON period, decreases a current amount of a current which flows through the source part 15 in an analogue manner at the time of turning on a semiconductor switch 6 during an ON period next to the ON period. Also with such a configuration, a current amount of a current which flows through the source part 15 is decreased based on a third pulse signal S4. Accordingly, it is possible to provide the semiconductor switch control circuit which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting a power source or at the time that an overload is applied. In such an operation, "decreases in an analogue manner" means that a current amount is decreased to a desired current amount such that a rising speed during a turn-on period becomes a predetermined speed.

Embodiment 3

Figure 21:
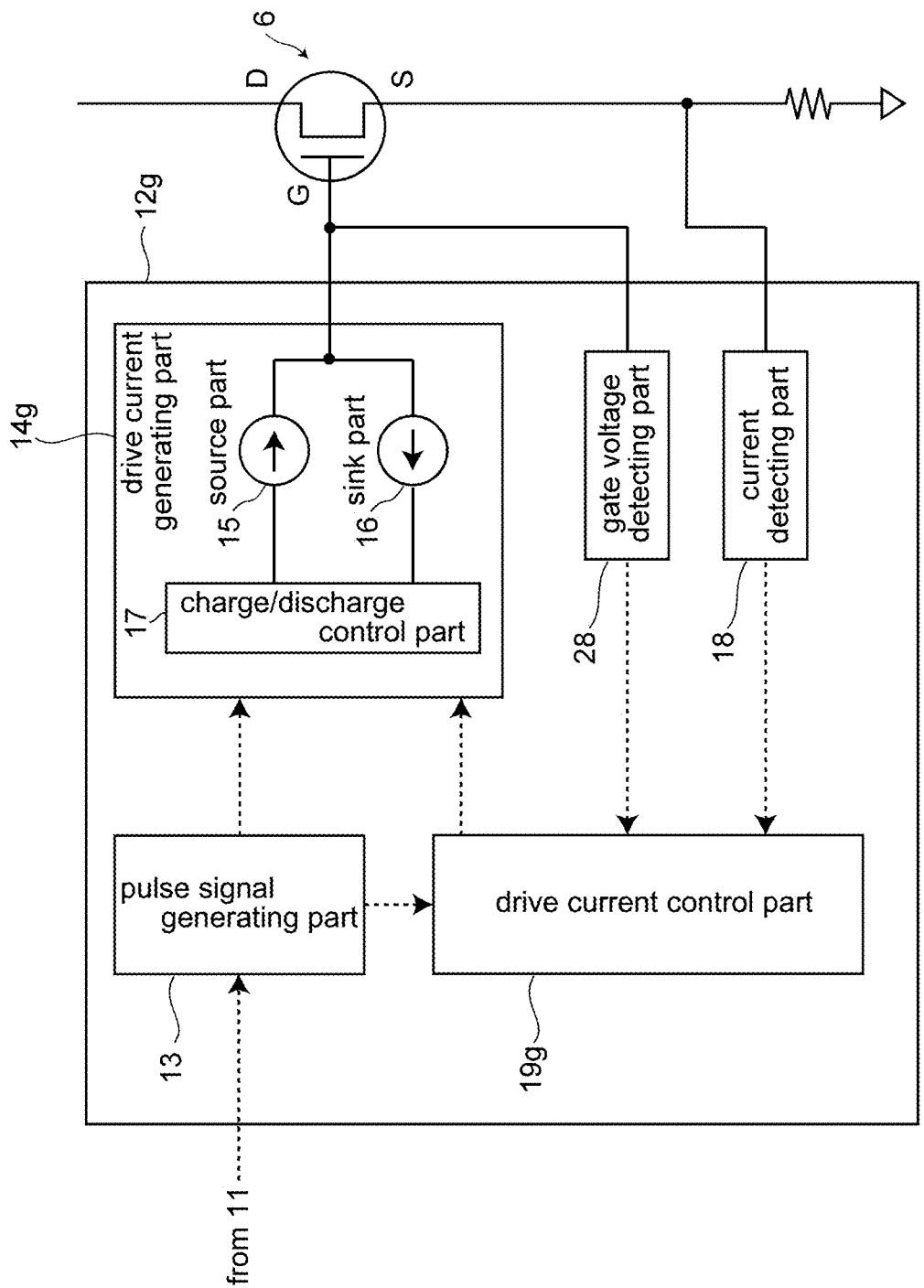
FIG. 21 is a view for describing a semiconductor switch control circuit 12g according to an embodiment 3.
Figure 22:
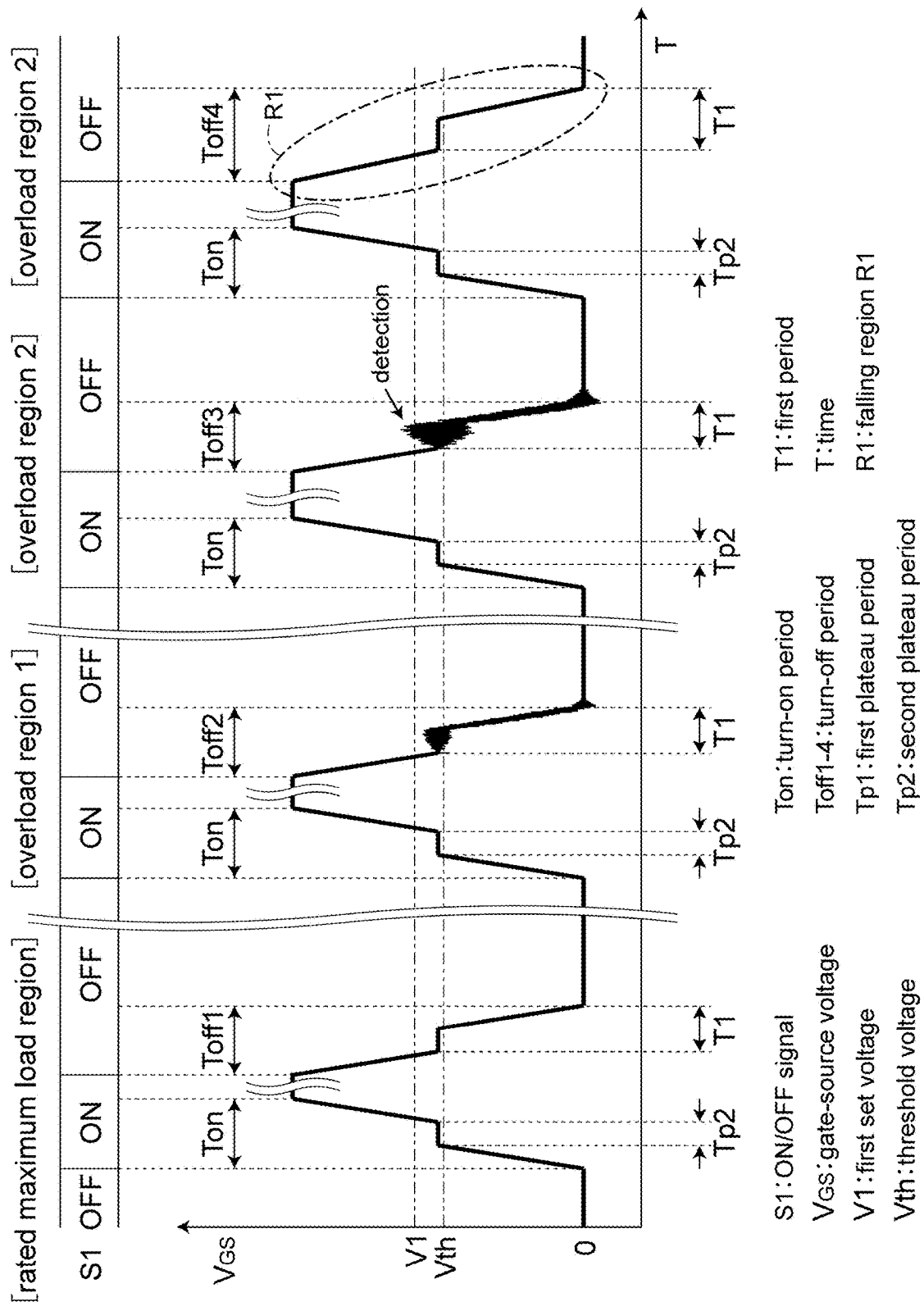
FIG. 22 is a view schematically showing a waveform of a gate voltage $V_{GS}$ at the time of performing a switching operation in a switching power source device according to the embodiment 3.
Figure 23:
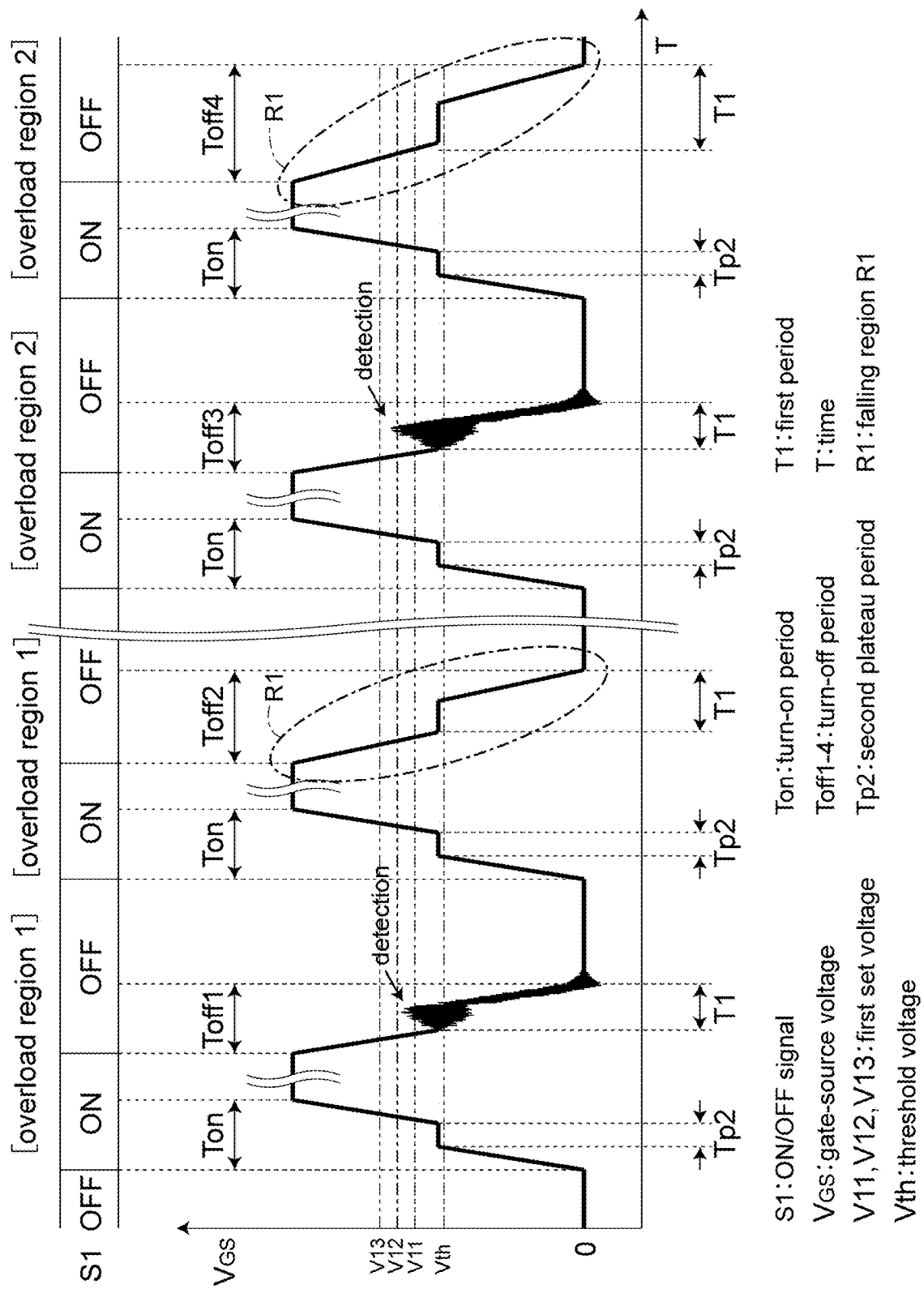
FIG. 23 is a view schematically showing a waveform of the gate voltage $V_{GS}$ at the time of performing the switching operation in a case where a plurality of voltage levels $V_{11}$, $V_{12}$ are set as a first set voltage $V_1$ in the switching power source device according to the embodiment 3.
Figure 24:
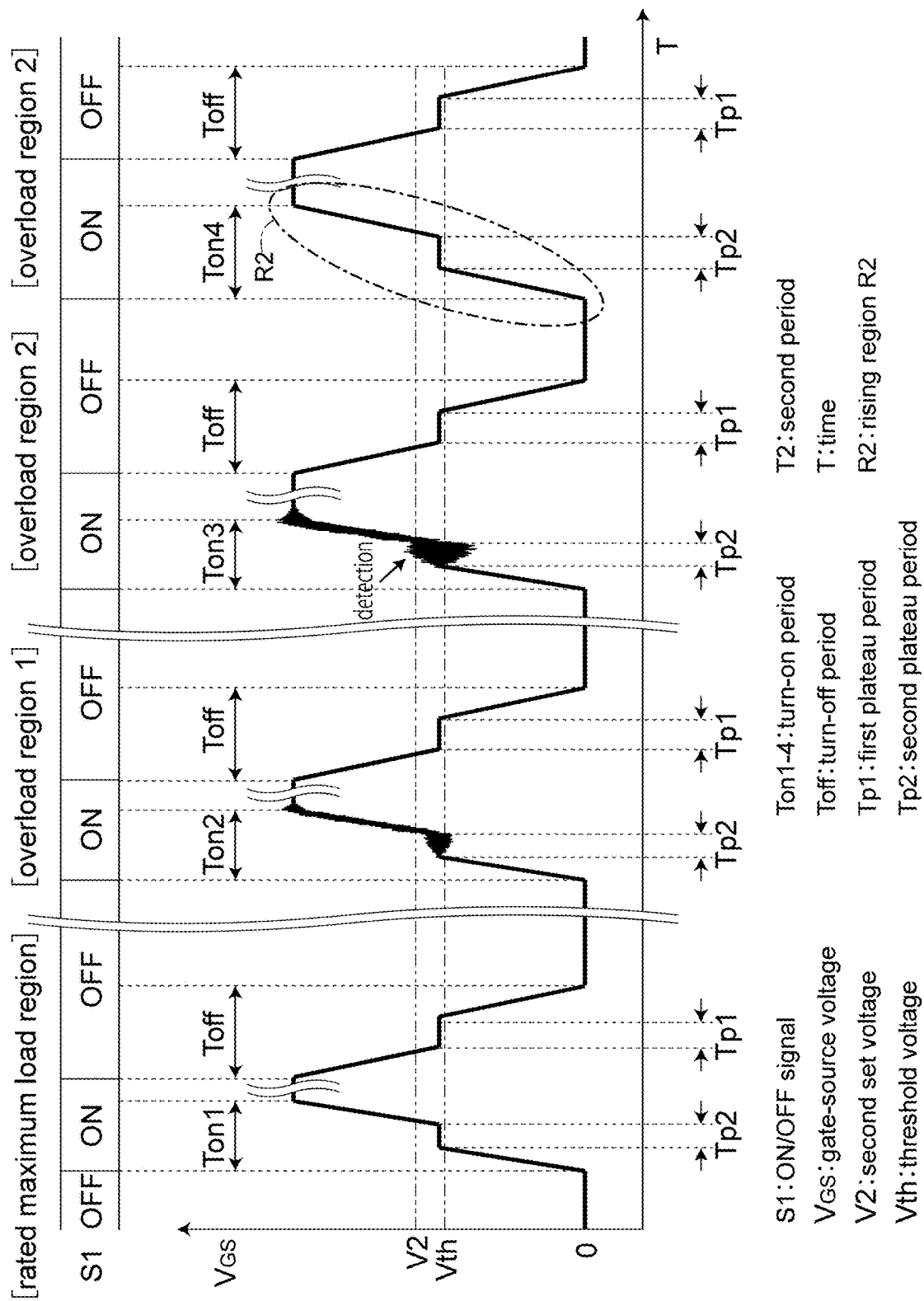
FIG. 24 is a view schematically showing a waveform of a gate voltage $V_{GS}$ at the time of performing the switching operation in the switching power source device according to the embodiment 3.
Figure 25:
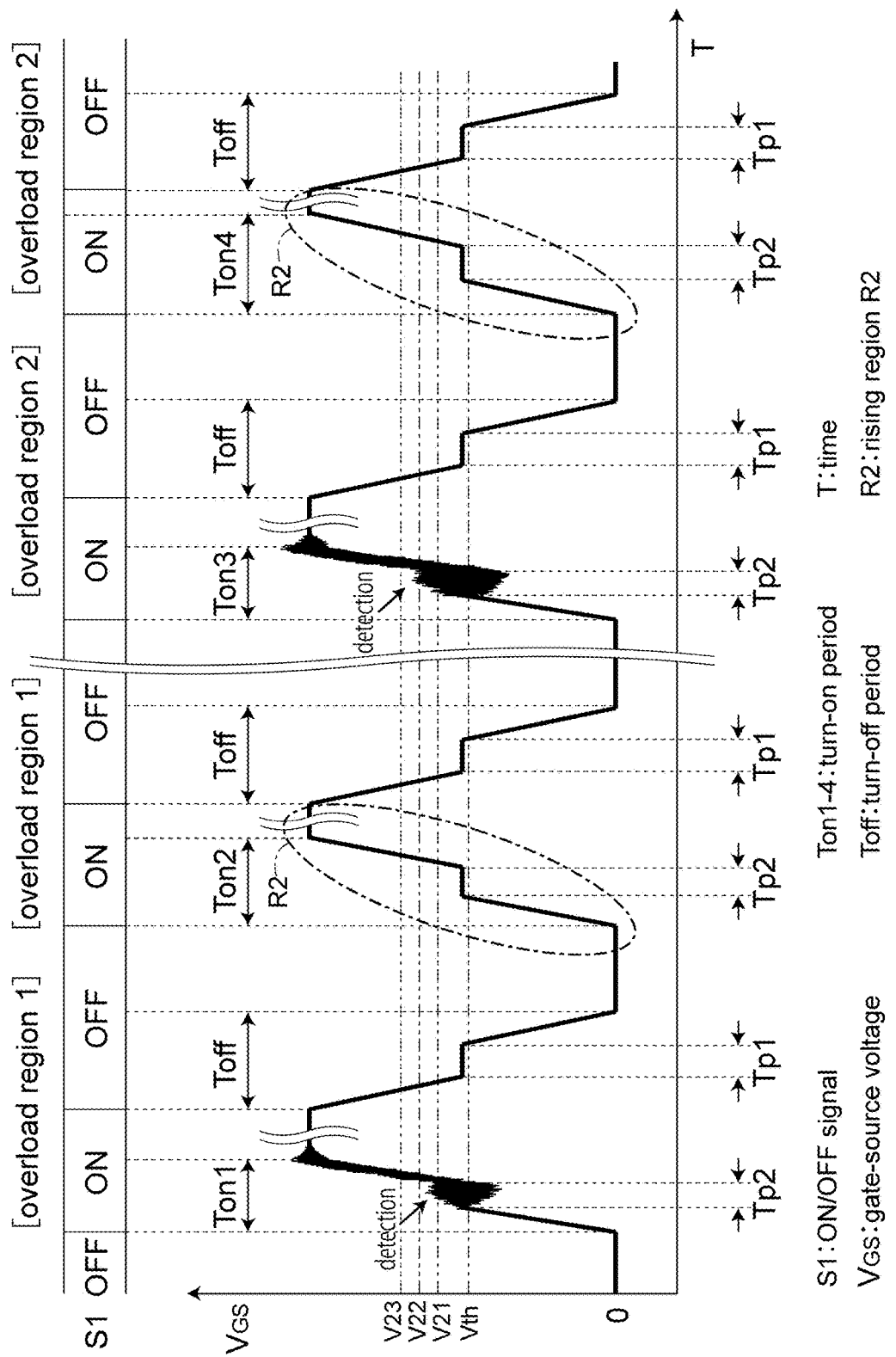
FIG. 25 is a view schematically showing a waveform of the gate voltage $V_{GS}$ at the time of performing the switching operation in a case where a plurality of voltage levels $V_{21}$, $V_{22}$ are set as a second set voltage $V_2$ in the switching power source device according to the embodiment 3.

FIG. 21 is a view for describing a semiconductor switch control circuit 12g according to an embodiment 3. FIG. 22 is a view schematically showing a waveform of a gate voltage $V_{GS}$ at the time of performing the switching operation in the switching power source device according to the embodiment 3. FIG. 23 is a view schematically showing the waveform of the gate voltage $V_{GS}$ at the time of performing the switching operation in a case where a plurality of voltage levels $V_{11}$, $V_{12}$ are set as a first set voltage $V_1$ in the switching power source device according to the embodiment 3. FIG. 24 is a view schematically showing a waveform of a gate voltage $V_{GS}$ at the time of performing the switching operation in the switching power source device according to the embodiment 3. FIG. 25 is a view schematically showing the waveform of the gate voltage $V_{GS}$ at the time of performing the switching operation in a case where a plurality of voltage levels $V_{21}$, $V_{22}$ are set as a second set voltage $V_2$ in the switching power source device according to the embodiment 3.

In FIG. 22 and FIG. 24, in the drawing, the waveform of the gate voltage $V_{GS}$ on the most left side is the waveform of the gate voltage $V_{GS}$ in a rated maximum load region, the waveform of the second gate voltage $V_{GS}$ as counted from the left side is the waveform of the gate voltage $V_{GS}$ in an overload region 1, and the waveforms of the third and fourth gate voltages $V_{GS}$ as counted from the left side are the waveforms of the gate voltages $V_{GS}$ in an overload region 2. The waveform of the fourth gate voltage $V_{GS}$ as counted from the left side is the waveform of the gate voltage $V_{GS}$ when a falling speed of the gate voltage $V_{GS}$ during a turn-off period is made slow (see symbol R1).

In FIG. 23 and FIG. 25, in the drawing, the waveform of the gate voltage $V_{GS}$ on the most left side and the waveform of the second gate voltage $V_{GS}$ as counted from the left side are the waveforms of the gate voltage $V_{GS}$ in the overload region 1, and the waveforms of the third and fourth gate voltages $V_{GS}$ as counted from the left side are the waveforms of the gate voltages $V_{GS}$ in the overload region 2. The waveform of the fourth gate voltage $V_{GS}$ as counted from the left side is the waveform of the gate voltage $V_{GS}$ when a rising speed of the gate voltage $V_{GS}$ during a turn-on period is made slow (see symbol R2).

The semiconductor switch control circuit 12g according to the embodiment 3 basically has substantially the same configuration as the semiconductor switch control circuit according to the embodiment 1. However, the semiconductor switch control circuit 12g according to the embodiment 3 differs from the semiconductor switch control circuit 12 according to the embodiment 1 with respect to a point that the semiconductor switch control circuit 12g further includes a gate voltage detecting part 28. That is, the semiconductor switch control circuit 12g according to the embodiment 3 further includes the gate voltage detecting part 28 which detects a gate voltage $V_{GS}$ of a semiconductor switch 6, and a drive current control part 19g has a function of controlling a drive current which the drive current generating part 14g generates based on a pulse signal which a pulse signal generating part 13 generates and a gate voltage which the gate voltage detecting part 28 detects.

With such a configuration, in the semiconductor switch control circuit 12g according to the embodiment 3, a drive current control part 19g has two functions, that is, the function of controlling a drive current which the drive current generating part 14 generates based on a pulse signal which a pulse signal generating part 13 generates and a current which a current detecting part 18 detects, and the function of controlling a drive current which the drive current generating part 14 generates based on a pulse signal which the pulse signal generating part 13 generates and a gate voltage which the gate voltage detecting part 28 detects. Accordingly, it is possible to provide the semiconductor switch control circuit which further minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied.

In the semiconductor switch control circuit 12g according to the embodiment 3, it is possible to control a drive current such that a falling speed or a rising speed of a gate voltage is lowered (becomes slow) at both timings, that is, at the time of turning off a semiconductor switch 6 or at the time of turning on the semiconductor switch 6 (see FIG. 21 to FIG. 25). Accordingly, it is possible to provide a semiconductor switch control circuit which further minimally generates self-oscillation even at the time of turning off the semiconductor switch 6 or at the time of turning on the semiconductor switch 6.

Further, in the semiconductor switch control circuit 12g according to the embodiment 3, a plurality of voltage levels can be set as a first set voltage V1 or a second set voltage V2, and it is possible to control a drive current such that a falling speed or a rising speed of a gate voltage is lowered in a stepwise manner in accordance with the detection of a current which exceeds a larger current level among a plurality of current levels by the gate voltage detecting part 28 (see FIG. 23 and FIG. 25). Accordingly, a falling speed or a rising speed of the gate voltage can be properly controlled corresponding to a degree of danger that self-oscillation is generated and hence, it is possible to acquire a necessary self-oscillation suppressing effect without unnecessarily prolonging a turn-off period and a turn-on period.

Embodiment 4

Figure 26:
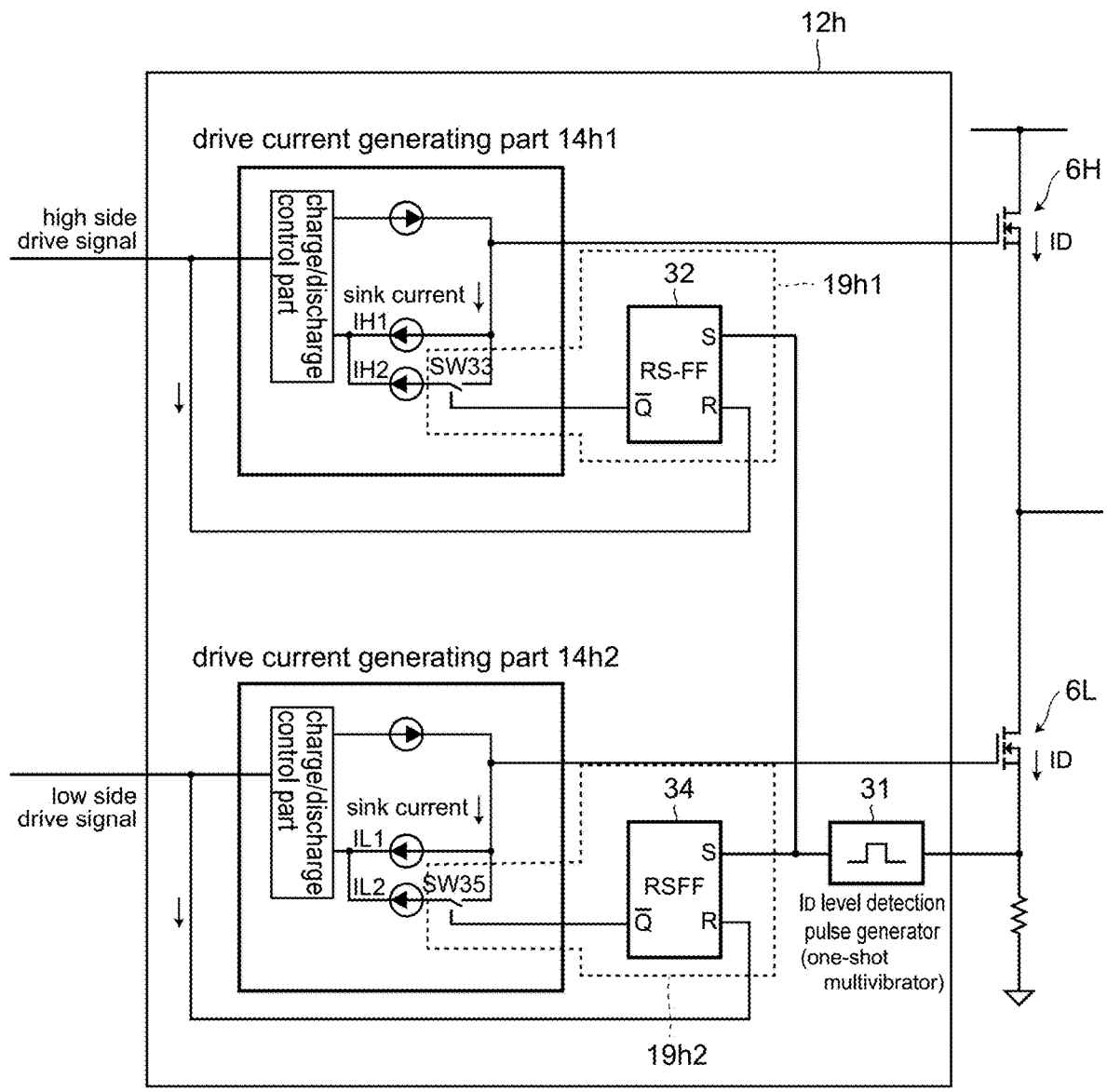
FIG. 26 is a view for describing a semiconductor switch control circuit 12h according to an embodiment 4.
Figure 27:
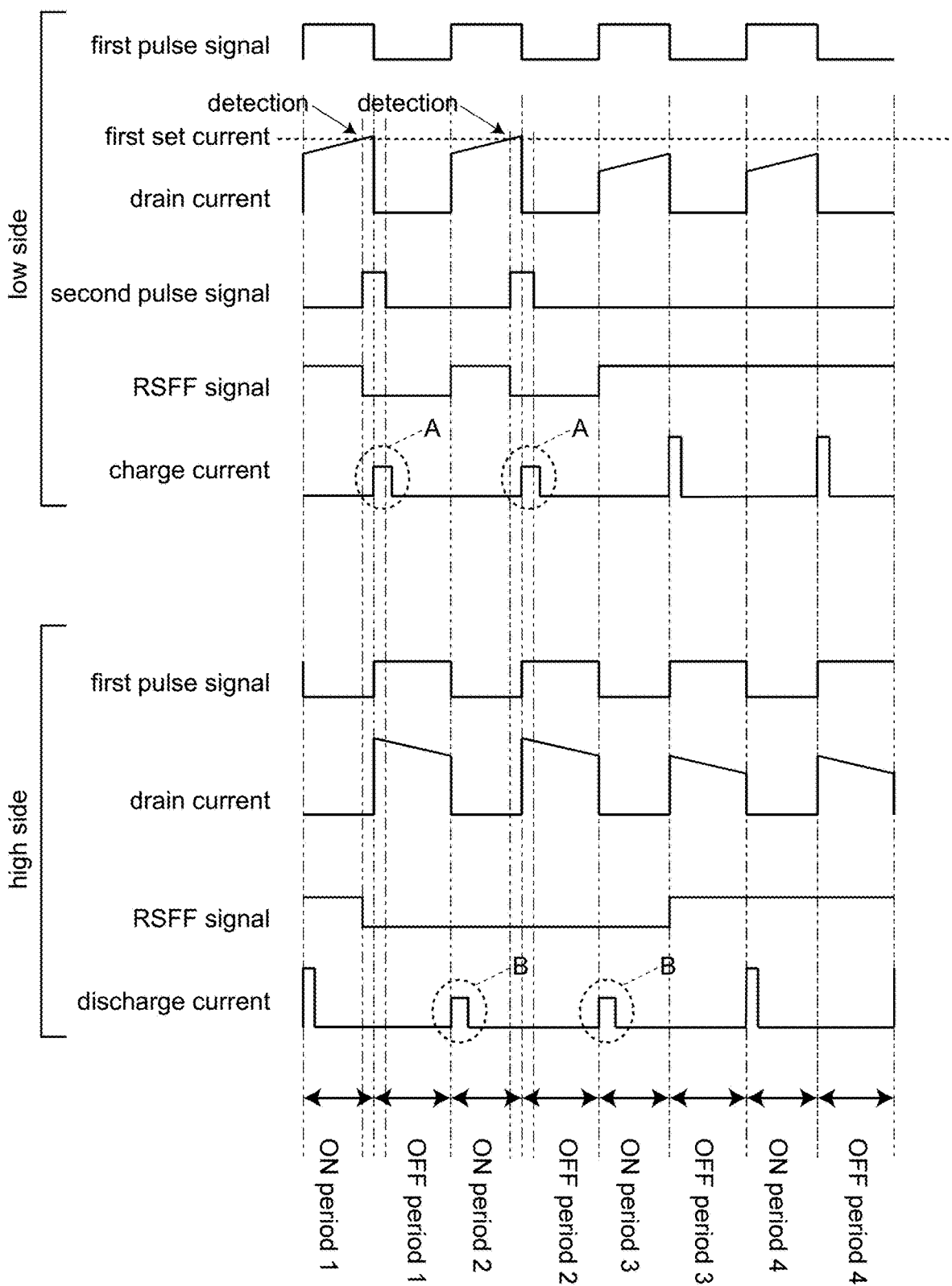
FIG. 27 is a view showing various kinds of waveforms in the semiconductor switch control circuit 12h according to the embodiment 4.

The semiconductor switch control circuit according to the present invention is formed as a semiconductor switch control circuit which further minimally generates self-oscillation even in a case where the semiconductor switch control circuit controls a plurality of semiconductor switches. FIG. 26 is a view for describing a semiconductor switch control circuit 12h according to an embodiment 4. FIG. 27 is a view showing various kinds of waveforms in the semiconductor switch control circuit 12h according to the embodiment 4.

As shown in FIG. 26, the semiconductor switch control circuit 12h according to the embodiment 4 includes: a first semiconductor switch 6H for a high side which has a first source electrode, a first drain electrode and a first gate electrode; and a second semiconductor switch 6L for a low side which has a second source electrode, a second drain electrode and a second gate electrode. That is, the semiconductor switch control circuit 12h is a semiconductor switch control circuit which performs an ON/OFF control of the first semiconductor switch 6H and the second semiconductor switch 6L by respectively supplying a first drive current and a second drive current to a first gate electrode and a second gate electrode of a half bridge circuit which is formed by connecting the first semiconductor switch 6H and the second semiconductor switch 6L in series.

The semiconductor switch control circuit 12h according to the embodiment 4 includes; a pulse signal generating part for first semiconductor switch (not shown in the drawing) which generates a pulse signal used as a time reference for performing an ON/OFF control of the first semiconductor switch 6H; a pulse signal generating part for second semiconductor switch (not shown in the drawing) which generates a pulse signal used as a time reference for performing an ON/OFF control of the second semiconductor switch 6L; a first drive current generating part 14h1 which generates a first drive current based on a pulse signal which the pulse signal generating part for first semiconductor switch generates, and supplies the first drive current to a first gate electrode of the first semiconductor switch 6H; a second drive current generating part 14h2 which generates a second drive current based on a pulse signal which the pulse signal generating part for second semiconductor switch generates, and supplies the second drive current to a second gate electrode of the second semiconductor switch 6L; a current detecting part (disposed in an $I_D$ level detection pulse generator 31) which detects a drain current or a source current of the first semiconductor switch 6H, a drain current or a source current of the second semiconductor switch 6L, or a current which flows through a predetermined current path of a peripheral circuit connected to the half bridge circuit (a drain current of the second semiconductor switch 6L in FIG. 26); a first drive current control part 19h1 which controls a first drive current which the first drive current generating part generates based on a first pulse signal which the pulse signal generating part for first semiconductor switch generates and a current which the current detecting part detects; and a second drive current control part 19h2 which controls a second drive current which the second drive current generating part generates based on a second pulse signal which the pulse signal generating part for second semiconductor switch generates and a current which the current detecting part detects.

With such a configuration, in the semiconductor switch control circuit 12h according to the embodiment 4, when a drain current of the second semiconductor switch 6L for a low side exceeds a first set current during an ON period of the second semiconductor switch 6L at the time of starting a power source or at the time that an overload is applied or the like (see FIG. 27), a second pulse signal is outputted to an RSFF 32 and an RSFF 34 from an In level detection pulse generator 31 (incorporating the current detecting part and the second pulse signal generator) (see FIG. 26 and FIG. 27). Accordingly, in the second drive current control part 19h2, a switch SW 35 stops a discharge operation in a discharge current path so that a discharge current is squeezed at the time of turning off a semiconductor switch following the ON period (see symbol A in FIG. 27) and hence, a falling speed of a gate voltage is lowered (becomes slow). In the first drive current control part 19h1, a switch 33 stops a charge operation in a charge current path so that a charge current is squeezed at the time of turning on the semiconductor switch during an ON period next to the ON period (see symbol B in FIG. 27) and hence, a rising speed of the gate voltage is lowered (becomes slow). Accordingly, at the timing at which a large switching current flows such as at the time of starting a power source or at the time where an overload is applied, both of a falling speed and a rising speed of the gate voltage is lowered (becomes slow). As a result, a phenomenon that a semiconductor switch or a circuit part around the semiconductor switch is broken due to self-oscillation and an erroneous operation of the semiconductor switch caused by the self-oscillation minimally occurs.

In the semiconductor switch control circuit 12h according to the embodiment 4, the second pulse signal generator and the third pulse signal generator are formed as an integral body, and are disposed in one $I_D$ detection pulse generator together with a current detecting part. Accordingly, in the semiconductor switch control circuit 12h according to the embodiment 4, the first set current $I_1$ and the second set current $I_2$ are set to the same value.

Although the present invention has been described heretofore based on the above-mentioned embodiments, the present invention is not limited to the above-mentioned embodiments. Various modifications can be carried out without departing from the gist of the present invention, and the following modifications are conceivable, for example.

Figure 28:
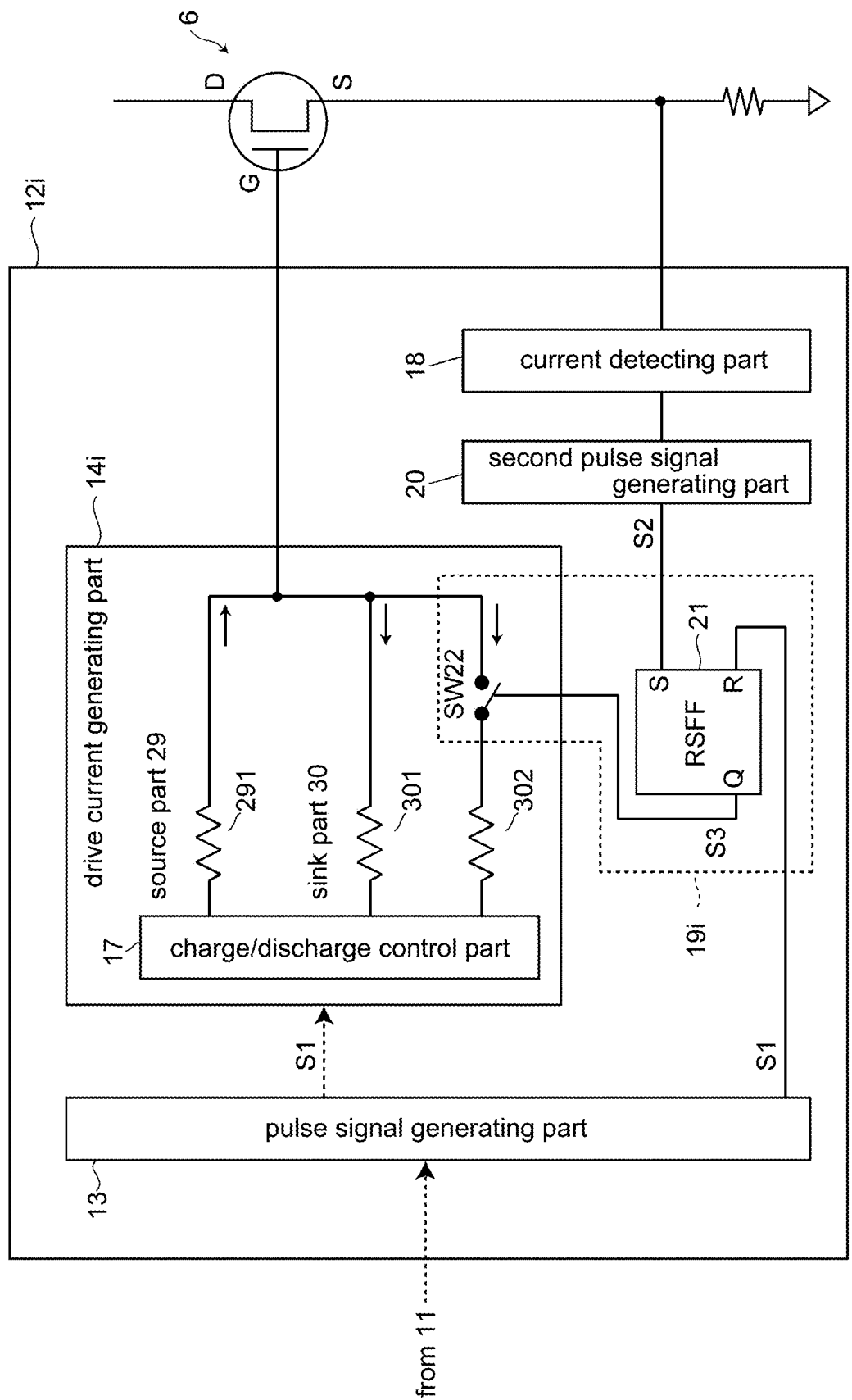
FIG. 28 is a view for describing a semiconductor switch control circuit 12i according to an embodiment 5.
Figure 29:
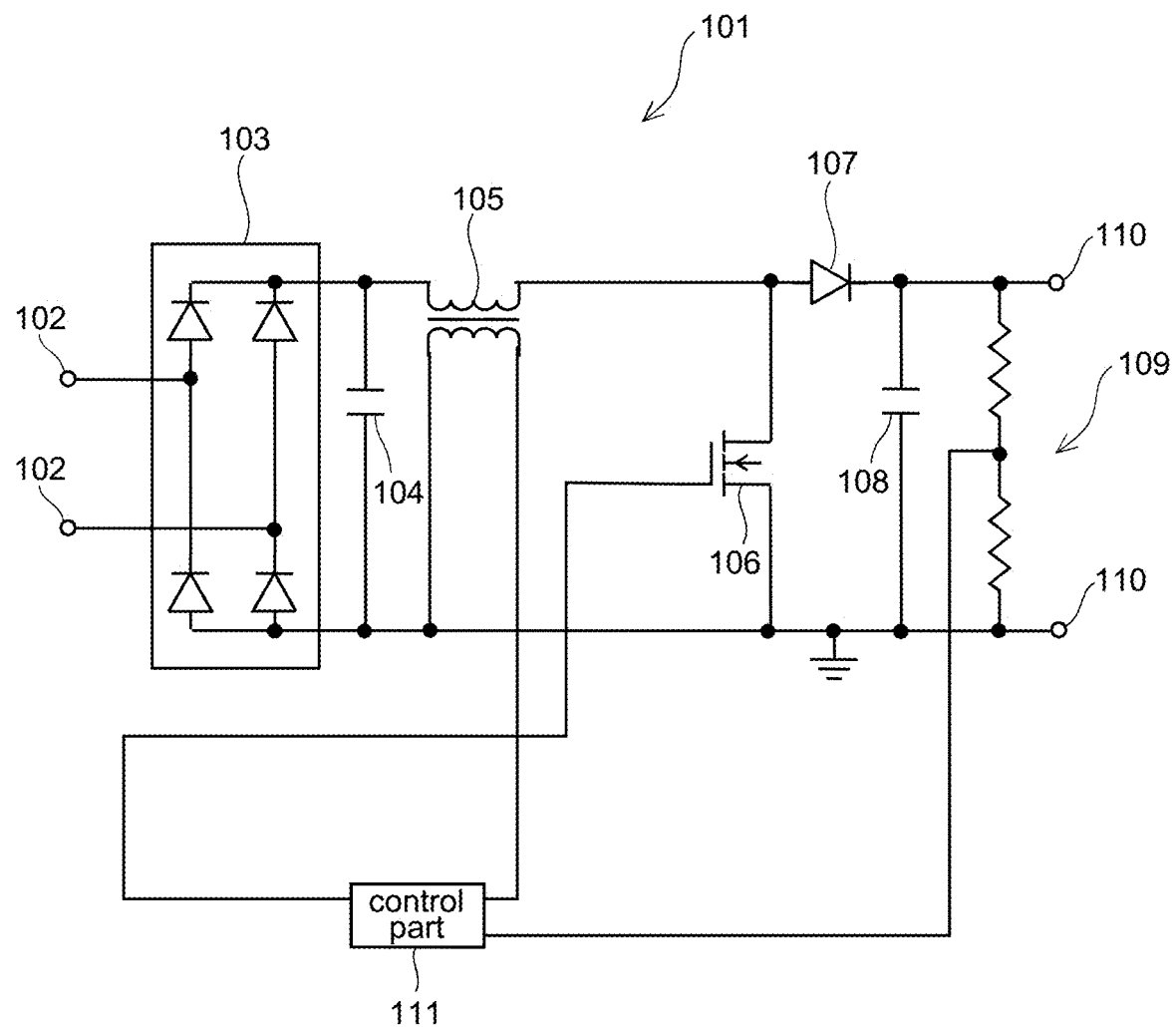
FIG. 29 is a circuit diagram of a conventional switching power source device 101.

(1) In the modifications 1 to 3 of the embodiment 1 and the modifications 1 to 3 of the embodiment 2 described above, although the discharge current path having the discharge current source is used as the discharge current path of the sink part 16, and the charge current path having the charge current source is used as the charge current path of the source part 15, the present invention is not limited to such a configuration. FIG. 28 is a view for describing a semiconductor switch control circuit 12i according to an embodiment 5. As shown in FIG. 28, a discharge current path having a resistance may be used as a discharge current path of a sink part 16, and a charge current path having a resistance may be used as a charge current path of a source part 15.

(2) In the above-mentioned respective embodiments, the case is described where the current detecting part 18 which detects a drain current $I_D$ (or a source current) of the semiconductor switch 6 is used as a current detecting part. However, the present invention is not limited to such a configuration. Other current detecting part which can detect a load current or an input current of the switching power source device or a current proportional to these currents (for example, a current in a current transformer or the like) may be used as the current detecting part.

(3) In the above-mentioned respective embodiments, the case is described where the semiconductor switch using a wide band gap semiconductor is used as a semiconductor switch. However, the present invention is not limited to such a configuration. For example, a usual semiconductor switch using silicon may be used as the semiconductor switch.

(4) In the above-mentioned respective embodiments, the case is described where the semiconductor switch control circuit is disposed between the control part 11 and the semiconductor switch 6. However, the present invention is not limited to such a configuration. A semiconductor switch control circuit may be integrally formed by assembling the semiconductor switch control circuit into the inside of a control part.

(5) In the above-mentioned respective embodiments, the case is described where the semiconductor switch control circuit is used for controlling the semiconductor switch in the switching power source device formed of a step-up chopper. However, the present invention is not limited to such a configuration. A semiconductor switch control circuit may be used for controlling a semiconductor switch in a switching power source device other than the switching power source device formed of a step-up chopper. For example, a semiconductor switch control circuit may be used for controlling a semiconductor switch of a switching power source device formed of a step-down chopper or a step-up/down chopper, a flyback power source such as a PWM (Pulse Width Modulation) or an RCC (Ringing Choke Converter) and the like.

(6) In the above-mentioned respective embodiments, the semiconductor switch control circuit is used for controlling the semiconductor switches in the non-insulation-type switching power source device. However, the present invention is not limited to such cases. The semiconductor switch control circuit can be used for controlling a semiconductor switch in a non-insulating-type switching power source device. For example, the semiconductor switch control circuit can be used for controlling a semiconductor switch such as a flyback converter or an LCC converter.

The invention claimed is:

1. A semiconductor switch control circuit configured to perform an ON/OFF control of a semiconductor switch having a source electrode, a drain electrode and a gate electrode by supplying a drive current to the gate electrode, the semiconductor switch control circuit comprising:
   a pulse signal generating part configured to generate a pulse signal which becomes a time reference for performing the ON/OFF control of the semiconductor switch;
   a drive current generating part configured to generate the drive current based on the pulse signal which the pulse signal generating part generates and to supply the drive current to the gate electrode of the semiconductor switch;
   a current detecting part configured to detect a drain current or a source current of the semiconductor switch, or a current which flows through a predetermined current path of a peripheral circuit of the semiconductor switch; and
   a drive current control part configured to have a function of controlling the drive current which the drive current generating part generates based on the pulse signal which the pulse signal generating part generates and the current which the current detecting part detects,
   wherein the drive current generating part includes:
      a source part configured to charge a current to the gate electrode of the semiconductor switch; and
      a sink part configured to discharge a current from the gate electrode of the semiconductor switch,
   wherein the drive current control part is configured to control the drive current by controlling a charge current to be charged to the gate electrode of the semiconductor switch, or a discharge current to be discharged from the gate electrode of the semiconductor switch, and
   wherein the drive current control part is configured, when a current which the current detecting part detects exceeds a predetermined first set current, to control the drive current such that a falling speed of a gate voltage during a turn-off period of the semiconductor switch becomes lower than the falling speed of the gate voltage before detection of the current by the current detecting part which exceeds the predetermined first set current.

2. The semiconductor switch control circuit according to claim 1, wherein the drive current control part is capable of setting a plurality of current levels as the first set current, and is configured to control the drive current such that the falling speed of the gate voltage is lowered in a stepwise manner in accordance with a detection of a current which exceeds a higher current level among the plurality of current levels by the current detection part.

3. The semiconductor switch control circuit according to claim 1, further comprising a second pulse signal generating part configured to generate a second pulse signal when a current which the current detecting part detects exceeds the first set current, wherein
   the drive current control part is configured to control the drive current based on the second pulse signal which the second pulse signal generating part generates.

4. The semiconductor switch control circuit according to claim 3, wherein
   the sink part includes a plurality of discharge current paths which are connected to each other in parallel, and
   the drive current control part includes: an R terminal into which the pulse signal from the pulse signal generating part is inputted; an S terminal into which the second pulse signal from the second pulse signal generating part is inputted; and a Q terminal from which a control signal for controlling the discharge current is outputted, and the drive current control part also includes an RS flip-flop which is configured, when the second pulse signal is inputted from the second pulse signal generating part during an ON period, to stop a discharge operation on at least one discharge current path out of the plurality of discharge current paths at the time of turning off the semiconductor switch following the ON period.

5. The semiconductor switch control circuit according to claim 3, wherein
   the sink part includes a plurality of discharge current paths which are connected to each other in parallel, and
   the drive current control part includes a charge/discharge control part which is configured, when the second pulse signal is inputted from the second pulse signal generating part during an ON period, to stop a discharge operation on at least one discharge current path out of the plurality of discharge current paths at the time of turning off the semiconductor switch following the ON period.

6. The semiconductor switch control circuit according to claim 5, wherein the plurality of discharge current paths respectively have different discharge abilities.

7. The semiconductor switch control circuit according to claim 3, wherein the drive current control part includes a charge/discharge control part which is configured, when the second pulse signal is inputted from the second pulse signal generating part during an ON period, to decrease, in an analogue manner, a current amount of a current which flows through the sink part at the time of turning off the semiconductor switch following the ON period.

8. The semiconductor switch control circuit according to claim 1, wherein the first set current or the second set current is set to a value which exceeds a current range of the drain current or the source current in a rated load region of the semiconductor switch or a current which flows through a predetermined current path of a peripheral circuit of the semiconductor switch.

9. The semiconductor switch control circuit according to claim 1, wherein the semiconductor switch is formed of a wide gap semiconductor.

10. The semiconductor switch control circuit according to claim 9, wherein the wide gap semiconductor is formed of silicon carbide, gallium nitride, gallium oxide or diamond.

11. A semiconductor switch control circuit configured to perform an ON/OFF control of a semiconductor switch having a source electrode, a drain electrode and a gate electrode by supplying a drive current to the gate electrode, the semiconductor switch control circuit comprising:
  a pulse signal generating part configured to generate a pulse signal which becomes a time reference for performing the ON/OFF control of the semiconductor switch;
  a drive current generating part configured to generate the drive current based on the pulse signal which the pulse signal generating part generates and to supply the drive current to the gate electrode of the semiconductor switch;
  a current detecting part configured to detect a drain current or a source current of the semiconductor switch, or a current which flows through a predetermined current path of a peripheral circuit of the semiconductor switch; and
  a drive current control part configured to have a function of controlling the drive current which the drive current generating part generates based on the pulse signal which the pulse signal generating part generates and the current which the current detecting part detects,
  wherein the drive current generating part includes:
    a source part configured to charge a current to the gate electrode of the semiconductor switch; and
    a sink part configured to discharge a current from the gate electrode of the semiconductor switch,
  wherein the drive current control part is configured to control the drive current by controlling a charge current to be charged to the gate electrode of the semiconductor switch, or a discharge current to be discharged from the gate electrode of the semiconductor switch, and
  wherein the drive current control part is configured, when a current which the current detecting part detects exceeds a predetermined second set current, to control the drive current such that a rising speed of the gate voltage during a turn-on period of the semiconductor switch becomes lower than the rising speed of the gate voltage before detection of the current by the current detecting part which exceeds the predetermined second set current.

12. The semiconductor switch control circuit according to claim 11, wherein the drive current control part is capable of setting a plurality of current levels as the second set current, and is configured to control the drive current such that the rising speed of the gate voltage is lowered in a stepwise manner in accordance with a detection of a current which exceeds a higher current level among the plurality of current levels by the current detection part.

13. The semiconductor switch control circuit according to claim 11, further comprising a third pulse signal generating part configured to generate a third pulse signal when a current which the current detecting part detects exceeds the second set current, wherein
  the drive current control part has a function of controlling the drive current based on the third pulse signal which the third pulse signal generating part generates.

14. The semiconductor switch control circuit according to claim 13, wherein
  the source part includes a plurality of charge current paths which are connected to each other in parallel, and
  the drive current control part includes: an R terminal into which the pulse signal from the pulse signal generating part is inputted; an S terminal into which the third pulse signal from the third pulse signal generating part is inputted; and a Q terminal from which a control signal for controlling the charge current is outputted, and the drive current control part also includes an RS flip-flop which is configured, when the third pulse signal is inputted from the third pulse signal generating part during an ON period, to stop a charge operation on at least one charge current path out of the plurality of charge current paths at the time of turning on the semiconductor switch during an ON period next to the ON period.

15. The semiconductor switch control circuit according to claim 13, wherein
  the source part includes a plurality of charge current paths which are connected to each other in parallel, and
  the drive current control part is configured, when the third pulse signal is inputted from the third pulse signal generating part during an ON period, to stop a charge operation on at least one charge current path out of the plurality of charge current paths at the time of turning on the semiconductor switch during an ON period next to the ON period.

16. The semiconductor switch control circuit according to claim 15, wherein the plurality of charge current paths respectively have different charge abilities.

17. The semiconductor switch control circuit according to claim 13, wherein the drive current control part includes a charge/discharge control part which is configured, when the third pulse signal is inputted from the third pulse signal generating part during an ON period, to decrease, in an analogue manner, a current amount of a current which flows through the source part at the time of turning on the semiconductor switch during an ON period next to the ON period.

18. A semiconductor switch control circuit configured to perform an ON/OFF control of a semiconductor switch having a source electrode, a drain electrode and a gate electrode by supplying a drive current to the gate electrode, the semiconductor switch control circuit comprising:

a pulse signal generating part configured to generate a pulse signal which becomes a time reference for performing the ON/OFF control of the semiconductor switch;

a drive current generating part configured to generate the drive current based on the pulse signal which the pulse signal generating part generates and to supply the drive current to the gate electrode of the semiconductor switch;

a current detecting part configured to detect a drain current or a source current of the semiconductor switch, or a current which flows through a predetermined current path of a peripheral circuit of the semiconductor switch;

a drive current control part configured to have a function of controlling the drive current which the drive current generating part generates based on the pulse signal which the pulse signal generating part generates and the current which the current detecting part detects; and a gate voltage detecting part configured to detect a gate voltage of the semiconductor switch, wherein the drive current control part is configured to have a function of controlling the drive current which the drive current generating part generates based on the pulse signal which the pulse signal generating part generates and the gate voltage which the gate voltage detecting part detects.

* * * * *